US006914227B2

United States Patent
Kaifu et al.

(10) Patent No.: US 6,914,227 B2
(45) Date of Patent: Jul. 5, 2005

(54) IMAGE SENSING APPARATUS CAPABLE OF OUTPUTTING IMAGE BY CONVERTING RESOLUTION BY ADDING AND READING OUT A PLURALITY OF PIXELS, ITS CONTROL METHOD, AND IMAGE SENSING SYSTEM

(75) Inventors: Noriyuki Kaifu, Tokyo (JP); Shin Kikuchi, Kanagawa (JP); Kazuaki Tashiro, Kanagawa (JP); Tetsunobu Kochi, Kanagawa (JP); Osamu Yuki, Tokyo (JP); Tomoyuki Noda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 231 days.

(21) Appl. No.: 10/174,990

(22) Filed: Jun. 20, 2002

(65) Prior Publication Data

US 2003/0010896 A1 Jan. 16, 2003

(30) Foreign Application Priority Data

Jun. 25, 2001 (JP) ........................................ 2001-191787
Jul. 3, 2001 (JP) ........................................ 2001-202352

(51) Int. Cl.[7] .............................................. H01L 27/00
(52) U.S. Cl. .............................. 250/208.1; 250/214 A; 348/300; 257/443
(58) Field of Search ....................... 250/208.1, 214 SW, 250/214 LS, 214 A; 348/300, 302, 304, 308; 257/441, 443, 444

(56) References Cited

U.S. PATENT DOCUMENTS

| | | | | |
|---|---|---|---|---|
| 5,949,483 A | * | 9/1999 | Fossum et al. | 348/303 |
| 6,011,295 A | * | 1/2000 | Merrill et al. | 257/443 |
| 6,137,151 A | * | 10/2000 | Street | 257/443 |
| 6,437,338 B1 | * | 8/2002 | Hoffman | 250/370.09 |
| 6,452,153 B1 | * | 9/2002 | Lauxtermann et al. | 250/208.1 |
| 6,580,455 B1 | * | 6/2003 | Wang et al. | 348/308 |
| 6,587,603 B1 | * | 7/2003 | Sakurai et al. | 382/312 |
| 2002/0158982 A1 | | 10/2002 | Kokubun et al. | 348/308 |

FOREIGN PATENT DOCUMENTS

CN    1383322 A    3/2002    .......... H04N/5/335

OTHER PUBLICATIONS

Office Action dated Apr. 23, 2004 wherein Chinese patent application CN1383322A is cited.

* cited by examiner

Primary Examiner—Stephone B. Allen
(74) Attorney, Agent, or Firm—Fitzpatrick, Cella, Harper & Scinto

(57) ABSTRACT

An image sensing apparatus has a plurality of pixels, and can output an image by converting its resolution by adding and reading out pixels for respective pixel groups each including a predetermined number of pixels of the plurality of pixels. Each pixel has a photoelectric conversion unit, an amplifier for amplifying and outputting a signal from the photoelectric conversion unit, and a capacitor connected to the output of the amplifier. The apparatus has a plurality of switches for commonly connecting between the capacitors of two or more pixels of the plurality of pixels.

11 Claims, 20 Drawing Sheets

D  DECODER
P  ONE PIXEL

IMAGE SENSING APPARATUS CAPABLE OF OUTPUTTING IMAGE BY CONVERTING RESOLUTION BY ADDING AND READING OUT A PLURALITY OF PIXELS, ITS CONTROL METHOD, AND IMAGE SENSING SYSTEM

FIELD OF THE INVENTION

The present invention relates to an image sensing apparatus, its control method, and an image sensing system and, more particularly, to an image sensing apparatus capable of outputting an image by converting its resolution by adding charges from a plurality of pixels, its control method, and an image sensing system.

BACKGROUND OF THE INVENTION

Image sensing apparatuses are roughly classified into a CCD sensor and CMOS sensor. The CCD sensor sequentially transfers photoelectrically converted charges in the vertical and horizontal directions. In the CMOS sensor, each pixel has an amplifier for amplifying a photoelectrically converted signal, and the amplified signals are sequentially output using vertical and horizontal scan circuits.

An image sensing apparatus is often required of an operation for reading out pixels at a high frame rate (speed) although the resolution lowers, in addition to a standard operation for reading out all pixels.

The CMOS sensor can attain random access scans by controlling the scans of the vertical and horizontal scan circuits, and can also scan while decimating pixels. In such case, since information of skipped pixels is discarded, it is disadvantageous for sensitivity.

Hence, a method that couples the outputs of neighboring photoelectric conversion units such as photodiodes via switches to add charges, in other words, to calculate the average value of potentials, and outputs the average has been proposed.

FIG. 19A is a circuit diagram for four pixels extracted from an image sensing apparatus. In FIG. 19A, a reset switch for each photodiode PD is not shown.

As shown in FIG. 19A, the cathodes (outputs) of four photodiodes PD are coupled by turning on add switches SW30, SW31, and SW32 to add charges, a pixel is selected by turning on a select switch SW20, and the average value of potentials is output from an amplifier Tr20 onto a vertical output line VL.

As another method, as shown in FIG. 19B, after a charge on a photodiode PD is transferred to each capacitor FD by turning on a transfer switch SW21, the transfer switch SW21 is turned off, and the capacitors FD are coupled by turning on add switches to add charges. Then, a pixel is selected by turning on a select switch SW20, and the average value of potentials is output from an amplifier Amp20 onto a vertical output line VL.

In general, since each photodiode PD accumulates a small amount of charge upon receiving light, the capacitance of the photodiode PD or the capacitor FD shown in FIG. 19B is preferably set to be as small as possible so as to obtain a high potential.

On the other hand, each add switch SW or its connection wire has a stray capacitance CSW in no small measure, which lowers sensitivity and also increases kTC noise.

Also, each add switch SW or its connection wire suffers a leakage current ISW. With this current, an important photocharge leaks. Also, noise increases due to shot noise generated in association with such leakage current.

That is, the add switch SW or its connection wire, which is added for the purpose of increasing sensitivity, lowers sensitivity.

FIG. 20 shows another example of the conventional addition method among pixels in an image sensing region of an image sensing apparatus. In the image sensing apparatus shown in FIG. 20, add switches are inserted between neighboring pixels P, and decoders D for controlling the corresponding add switches are provided in correspondence with the add switches. Furthermore, a plurality of control lines CL run in the image sensing apparatus to control the decoders D. In an addition mode of the image sensing apparatus, the decoders D are controlled to individually turn on/off the add switches.

However, when the add switches are inserted between neighboring pixels and switch controllers such as decoders and control lines are provided for the respective add switches, an addition circuit occupies a large area in the image sensing region.

SUMMARY OF THE INVENTION

The present invention has been made in consideration of the above situation, and has as its first object to suppress sensitivity drop upon adding and reading out pixels for resolution conversion.

According to the present invention, the foregoing first object is attained by providing an image sensing apparatus comprising: a plurality of pixels, each of the plurality of pixels having a photoelectric conversion unit, a first amplifier for amplifying and outputting a signal from the photoelectric conversion unit, and a capacitor connected to an output of the first amplifier; and a plurality of first switches for commonly connecting the capacitors of not less than two pixels of the plurality of pixels.

It is the second object of the present invention to reduce the circuit scale for adding and reading out pixels.

According to the present invention, the foregoing second object is attained by providing an image sensing apparatus comprising: a plurality of pixels arranged in a two-dimensional matrix; first switches used to couple pixels in a first pixel group formed by a predetermined number of pixels so as to add and read out signals of the first pixel group; second switches used to couple a plurality of first pixel groups so as to add and read out signals of a second pixel group formed by the plurality of first pixel groups; a first control line which is connected to the first switches in the plurality of first pixel groups and is used to ON/OFF control the first switches; a second control line which is connected to the second switches and is used to ON/OFF-control the second switches; and a controller for controlling the first and second switches via the first and second control lines, and in that image sensing apparatus has a first mode of independently reading out signals from a plurality of pixels, a second mode of adding and reading out signals for the respective first pixel groups, and a third mode of adding and reading out signals for the respective second pixel groups, and the controller controls to turn off the first and second switches in the first mode, to turn on the first switches and turn off the second switches in the second mode, and to turn on the first and second switches in the third mode.

The foregoing second object is also attained by providing a control method for controlling an image sensing apparatus having a plurality of pixels arranged in a two-dimensional matrix, first switches used to couple pixels in a first pixel group formed by a predetermined number of pixels so as to add and read out signals of the first pixel group, second switches used to couple a plurality of first pixel groups so as to add and read out signals of a second pixel group formed by the plurality of first pixel groups, a first control line which is connected to the first switches in the plurality of first pixel groups and is used to ON/OFF control the first switches, and a second control line which is connected to the second switches and is used to ON/OFF control the second switches, and the image sensing apparatus having a first mode of independently reading out signals from a plurality of pixels, a second mode of adding and reading out signals for the respective first pixel groups, and a third mode of adding and reading out signals for the respective second pixel groups, wherein control is made via the first and second control lines to turn off the first and second switches in the first mode, to turn on the first switches and turn off the second switches in the second mode, and to turn on the first and second switches in the third mode.

Further, foregoing second object is also attained by providing an image sensing apparatus comprising: a plurality of pixels arranged in a two-dimensional matrix; first switches used to couple pixels in a first pixel group formed by a predetermined number of pixels so as to add and read out signals of the first pixel group; second switches used to couple a plurality of first pixel groups so as to add and read out signals of a second pixel group formed by the plurality of first pixel groups; a first control line which is connected to the first switches in the plurality of first pixel groups and is used to ON/OFF control the first switches; a second control line which is connected to the second switches and is used to ON/OFF control the second switches; a select circuit for outputting select signals used to select pixel strings each of which consists of a plurality of pixels arranged in a predetermined direction; and a conversion circuit for converting the select signals into control signals used to control the first and second switches, and in that image sensing apparatus has a first mode of independently reading out signals from a plurality of pixels, a second mode of adding and reading out signals for the respective first pixel groups, and a third mode of adding and reading out signals for the respective second pixel groups, and the conversion circuit converts the select signals into signals which turn off the first and second switches in the first mode, signals which turn on the first switches and turn off the second switches in the second mode, and signals which turn on the first and second switches in the third mode, and outputs the converted signals onto the first and second control lines.

Furthermore, foregoing second object is also attained by providing a control method for controlling an image sensing apparatus having a plurality of pixels arranged in a two-dimensional matrix, first switches used to couple pixels in a first pixel group formed by a predetermined number of pixels so as to add and read out signals of the first pixel group, second switches used to couple a plurality of first pixel groups so as to add and read out signals of a second pixel group formed by the plurality of first pixel groups, a first control line which is connected to the first switches in the plurality of first pixel groups and is used to ON/OFF control the first switches, a second control line which is connected to the second switches and is used to ON/OFF control the second switches, a select circuit for outputting select signals used to select pixel strings each of which consists of a plurality of pixels arranged in a predetermined direction, and a conversion circuit for converting the select signals into control signals used to control the first and second switches, and the image sensing apparatus having a first mode of independently reading out signals from a plurality of pixels, a second mode of adding and reading out signals for the respective first pixel groups, and a third mode of adding and reading out signals for the respective second pixel groups, wherein the select signals are converted into signals which turn off the first and second switches in the first mode, signals which turn on the first switches and turn off the second switches in the second mode, and signals which turn on the first and second switches in the third mode, and the converted signals are supplied onto the first and second control lines.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described in detail in accordance with the accompanying drawings.

(First Embodiment)

Figure 1:
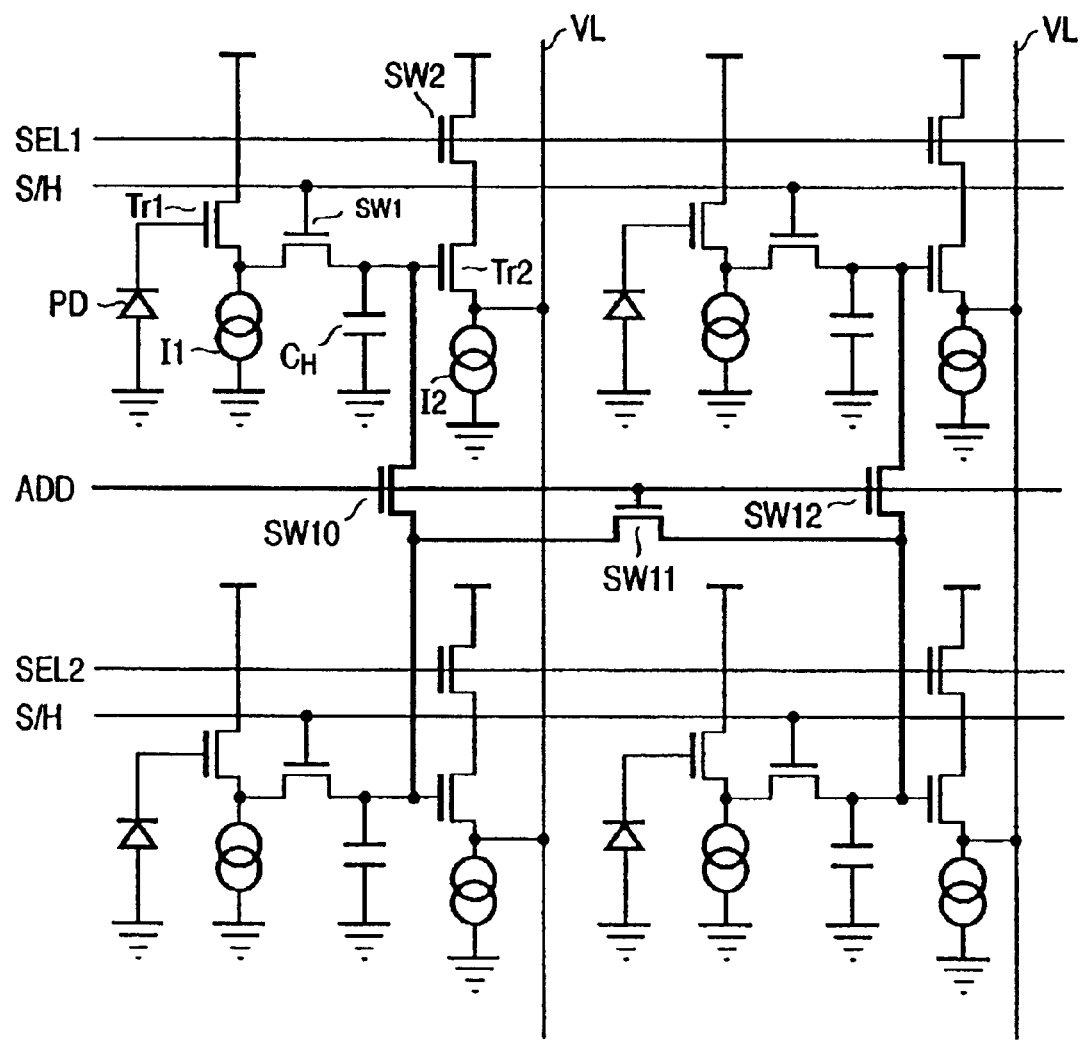
FIG. 1 is a circuit diagram showing the circuit arrangement for four pixels of an image sensing apparatus according to a first embodiment of the present invention.
Figure 2:
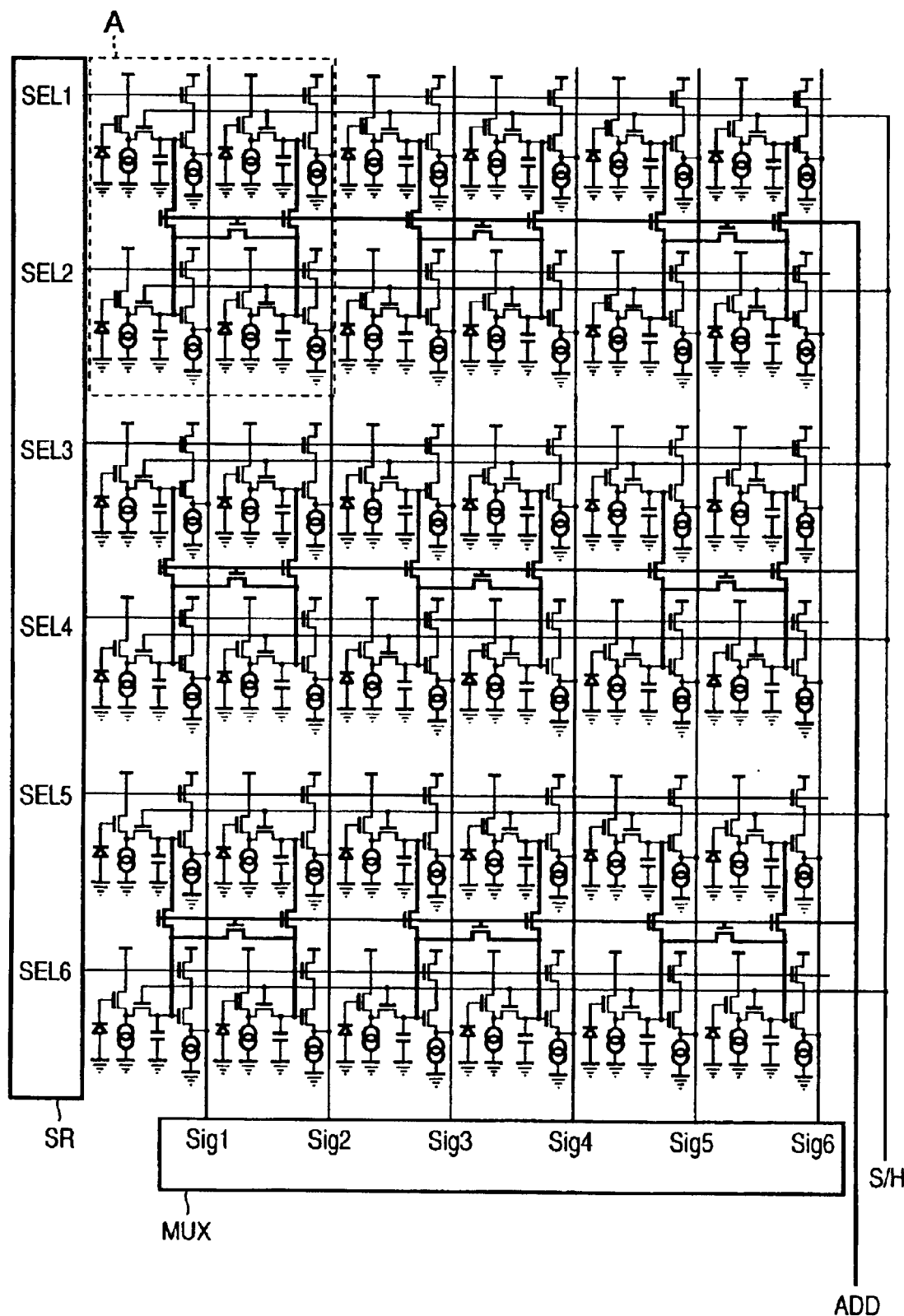
FIG. 2 is a circuit diagram showing the circuit arrangement of an image sensing apparatus obtained by arranging the pixels shown in FIG. 1 in a matrix.

FIG. 1 shows the circuit arrangement for four pixels according to the first embodiment of an image sensing apparatus of the present invention. FIG. 2 shows the circuit arrangement of an image sensing apparatus formed by arranging pixels in a matrix. In FIGS. 1 and 2, a reset switch of a photodiode in each pixel is not shown. Region A in FIG. 2 indicates a pixel region for four pixels to be added.

As shown in FIG. 1, one pixel comprises a photodiode PD, a transistor Tr1 (MOS transistor in this embodiment), the gate of which is connected to the cathode of the photodiode PD, and which amplifies and outputs a signal accumulated on the photodiode PD, a current source I1 (the transistor Tr1 and current source I1 form an amplifier) which is connected to the drain of the transistor Tr1, a sampling switch SW1 connected to the drain of the transistor Tr1, a capacitor CH for holding a signal transferred via the switch SW1, a transistor Tr2 (MOS transistor in this embodiment) which further amplifies and outputs a signal held by the capacitor CH, a pixel select switch SW2 connected to the source of the transistor Tr2, and a current source I2 connected to the drain of the transistor Tr2. The drain of the transistor Tr2 is connected to a vertical output line VL.

Pixels which neighbor in the longitudinal direction of the vertical output line VL are connected via switches SW10 and SW12 at nodes between the capacitor CH and the gate of the transistor Tr2 of each pixel. Also, pixels which neighbor in a direction perpendicular to the longitudinal direction of the vertical output line VL are connected via a switch SW11 at nodes between the capacitor CH and the gate of the transistor Tr2 of each pixel.

When an ADD signal is set at high level, all the switches SW10, SW11, and SW12 are turned on, and the nodes (each between the capacitor CH and the gate of the transistor Tr2) connected via the switches SW10, SW11, and SW12 are connected commonly.

Figure 3A:
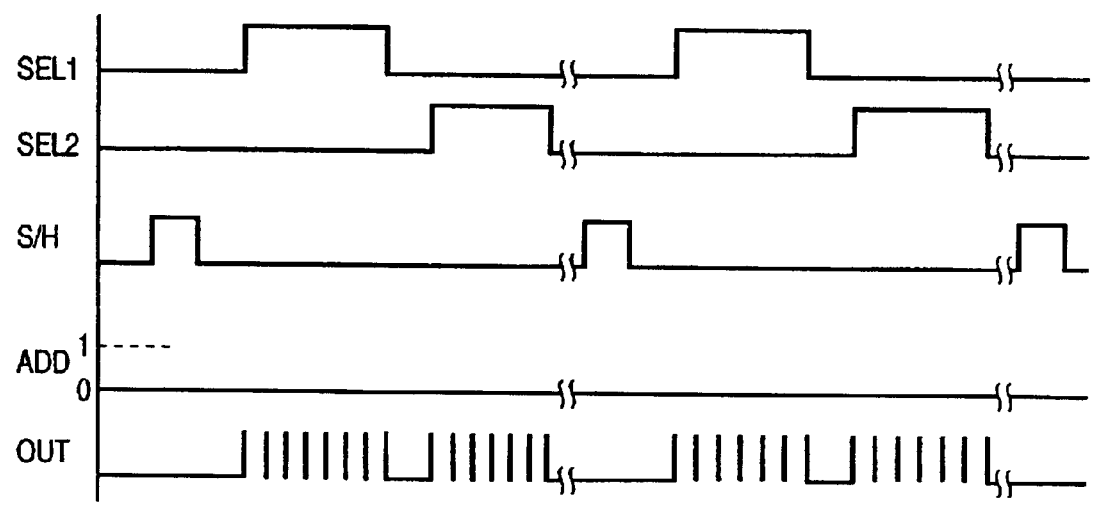
FIGS. 3A and 3B are timing charts showing the operation of the image sensing apparatus according to the first embodiment of the present invention.

FIG. 3A is a timing chart showing a normal drive mode (normal mode) of the image sensing apparatus with the above arrangement, and signals are independently read out from respective pixels in the normal mode. In the normal mode, an ADD signal is always set at low level to keep the switches SW10, SW11, and SW12 OFF.

A sample/hold signal S/H is set at high level to turn on the switch SW1, so as to sample a signal (amplified signal) corresponding to a charge accumulated on the photodiode PD, and to hold that signal in the capacitor CH. In this case, all pixels simultaneously undergo sample & hold operation.

Select signals SEL1, SEL2, SEL3, . . . output from a shift register (SR) serving as a vertical scan circuit are sequentially set at high level, and signals held by the capacitors CH are amplified and output by a pixel group, that is a group of pixels arranged as a horizontal line and simultaneously applied with a select signal, onto the vertical output lines VL. The signals output onto the vertical output lines VL are selected in turn by a horizontal scan circuit MUX while the corresponding select signals are at high level, and are output as output signals OUT.

Figure 3B:
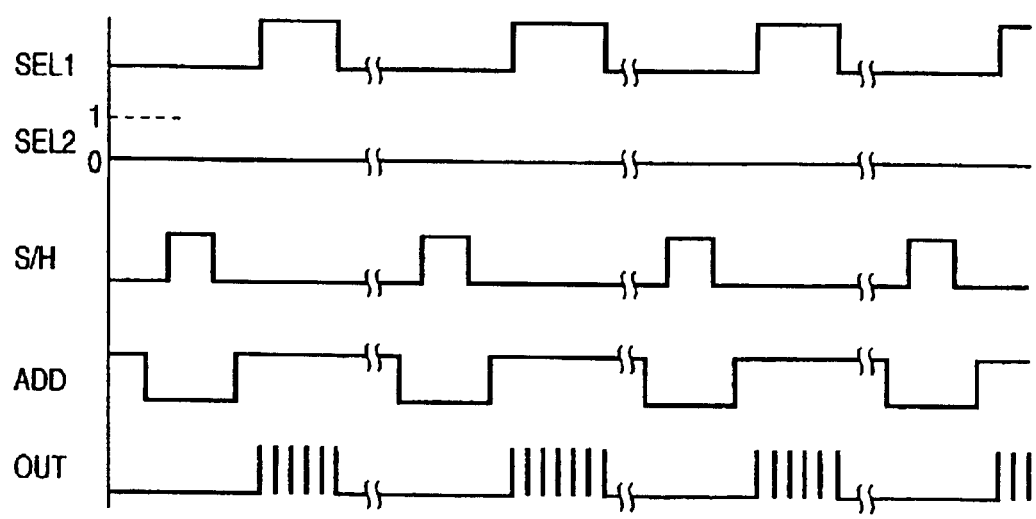

FIG. 3B is a timing chart showing an add & read drive mode (add mode) of the image sensing apparatus with the above arrangement.

A sample/hold signal S/H is set at high level to turn on the switch SW1, so as to sample a signal (amplified signal) corresponding to a charge accumulated on the photodiode PD, and to hold that signal in the capacitor CH. In this case, all pixels simultaneously undergo sample & hold operation.

Then, the sample/hold signal S/H is set at low level to turn off the switch SW1, and an ADD signal is set at high level to turn on the switches SW10, SW11, and SW12. The potential of the capacitor CH of each pixel equals the average potential of the potentials in the capacitors CH of the four pixels before addition in units of four pixels.

Select signals for every other rows output from the shift register (SR) are sequentially set at high level like SEL1, SEL3, SEL5, . . . (or SEL2, SEL4, SEL6, . . . ), and signals held by the capacitors CH are amplified and output by a pixel group, that is a group of pixels arranged as a horizontal line and simultaneously applied with a select signal, onto the vertical output lines VL. At this time, since the potentials of the capacitors CH for four pixels are equal to each other, select signals SEL2, SEL4, SEL6, . . . (or SEL1, SEL3, SEL5, . . . ) need not be set at high level.

The signals output onto the vertical output lines are selected every other columns by the horizontal scan circuit MUX while the corresponding select signals are at high level, and the average outputs of four pixels are output as output signals OUT.

In the normal mode shown in FIG. 3A, outputs from all the pixels are output from the horizontal scan circuit MUX. In contrast, in the add mode shown in FIG. 3B, outputs from pixels corresponding to ¼ of all the pixels are output from the circuit MUX. Hence, the time required for one frame can be shortened to ¼. That is, the frame rate can be nearly four times of that in the normal mode.

If each capacitor CH has a large capacitance, since the transistor Tr1 outputs a voltage, the potential is never reduced. Furthermore, even when each add switch SW or its wire has a stray capacitance, the potential never drops.

Since each capacitor CH can be increased, even when each add switch or its wire suffers a leakage current, such leakage current results in neither sensitivity drop nor an increase in noise. In this case, the effect can be enhanced if the capacitor CH is larger than the capacitance of the photodiode PD.

In the first embodiment, the transistors Tr1 and Tr2 and the current sources I1 and I2, which serve as amplifiers, respectively form source-follower circuits, and do not amplify voltages but amplify charges. Of course, the effect of the present invention can be obtained if they amplify voltages. In this case, the effect can be enhanced if the product of the gain of a voltage and the capacitor CH is larger than the capacitance of the photodiode PD.

Since each capacitor CH can be increased, the channel width of the transistor Tr2 (MOS transistor) for the source-follower circuit used to output a signal onto the vertical output line VL can also be increased. In the conventional apparatus, it is difficult to increase the channel width of the transistor Tr2, since the gate capacitance of the transistor Tr2 results in sensitivity drop if the channel width of the transistor Tr2 is increased. Since shot noise of a MOS transistor is inversely proportional to the (½)th power of (channel width W)×(channel length L), noise generated by the source-follower circuit used to output a signal onto the vertical output line VL can be negligibly small if the channel width W of the MOS transistor Tr2 is increased.

Also, shot noise and 1/f noise of the MOS transistor Tr1 of the source-follower circuit, which receives the output from the photodiode PD, can also be reduced. More specifically, since the channel width of the MOS transistor Tr1 is preferably reduced to prevent sensitivity drop due to the influence of the gate capacity, the MOS transistor Tr1 generates shot noise and 1/f noise to some extent.

In the normal mode, such noise appears on the output. However, in the add mode, since the potentials of individual pixels with noise can be averaged by the add switch SW, a noise voltage can be reduced. Since individual random noise components are averaged, if the average for four pixels is calculated, noise can be reduced to the (½)th power of ¼, i.e., ½.

In the first embodiment, outputs are added in units of four pixels. Also, outputs may be added in units of nine or 16 pixels. In this case, this effect can be further enhanced.

Figure 19A:
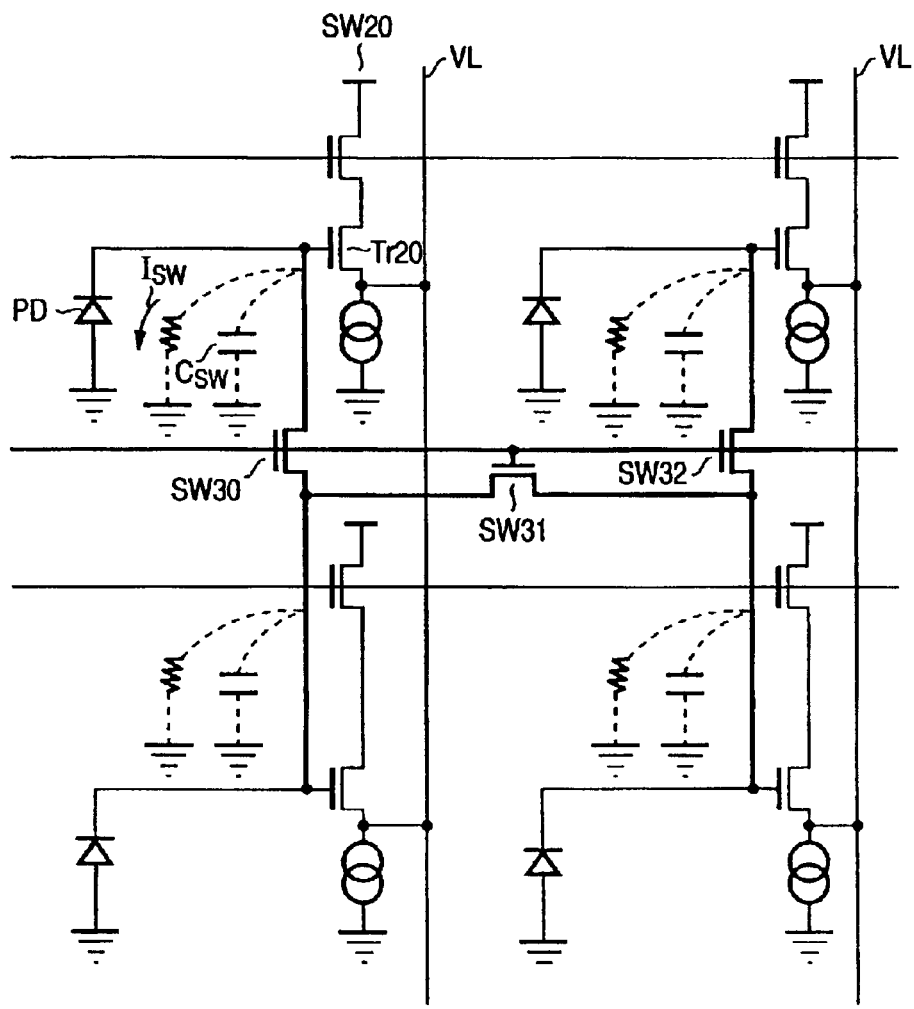
FIGS. 19A and 19B are circuit diagrams showing the pixel arrangement in a conventional image sensing apparatus.
Figure 19B:
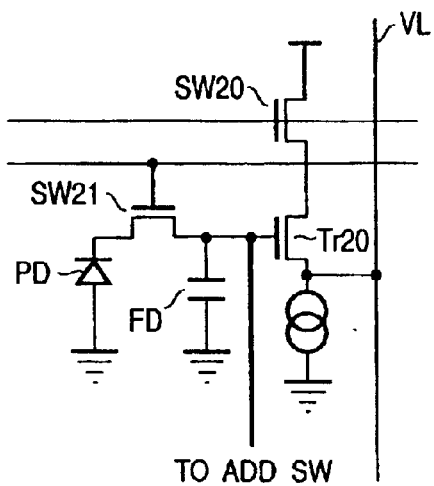
Figure 20:
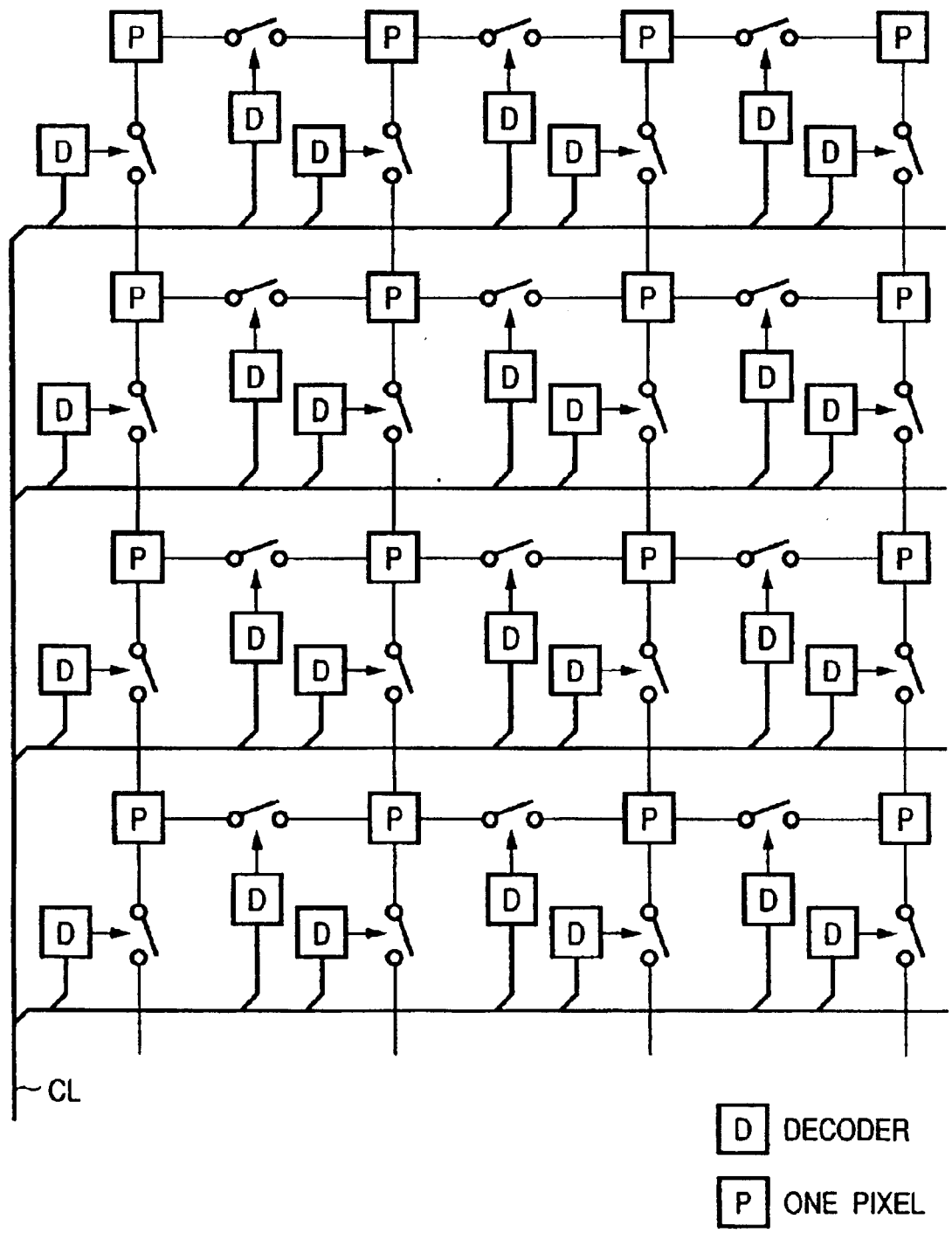
FIG. 20 is a circuit diagram showing an example of the addition method among pixels in an image sensing region of a conventional image sensing element.

The image sensing apparatus according to the first embodiment of the present invention will be explained by contrast with the conventional image sensing apparatus shown in FIGS. 19A and 19B. In general, the performance of the image sensing apparatus is evaluated by (sensitivity/noise), i.e., the S/N ratio. Assume that n pixels are added in this case.

Sensitivity Sp of the prior art is described by:

$$Sp = \alpha \cdot Ss$$

where Ss is the normal sensitivity of one photodiode PD, and $\alpha$ ($\alpha<1$) is the decreasing rate due to the capacitance of the add switch.

Noise Np is described by:

$$Np = Np^{}(1/n) + Nm (^{} \text{ is an exponential operator})$$

where Ns is noise of one photodiode PD before addition, and Nm is noise of the MOS transistor Tr20 of the source-follower circuit. The reason why Nm remains unchanged is that a charge after addition is output via one source-follower circuit.

Since sensitivity Si in the first embodiment suffers nearly no drop due to the capacitance of the add switch, it is given by:

$$Si = Ss$$

Since noise of the MOS transistor Tr2 in the source-follower circuit used to output a signal onto the vertical output line VL is negligible, Ni of the first embodiment is given by:

$$Ni = (Ns + Nm)^{**}(1/n)$$

where Nm is noise of the MOS transistor Tr1 of the source-follower circuit connected to the photodiode PD.

That is, Sp<Si and Np>Ni. Hence, the S/N ratio as the guideline of the performance is:

$$Sp/Np << Si/Ni$$

Therefore, the effect of the first embodiment is remarkable.

In addition to the aforementioned S/N ratio improvement effect, the first embodiment can provide the following effect. That is, since a signal charge is transferred to the capacitor CH in each pixel in response to the S/H signal, charges photoelectrically converted by the photodiodes PD in all the pixels can be transferred at the same timing irrespective of the row positions of pixels in one image sensing apparatus. For this reason, an image can be prevented from being distorted, and images obtained from neighboring image sensing apparatuses on a large-scale sensor panel prepared by putting a large number of image sensing apparatuses together can be prevented from being discontinuous.

(Second Embodiment)

Figure 4:
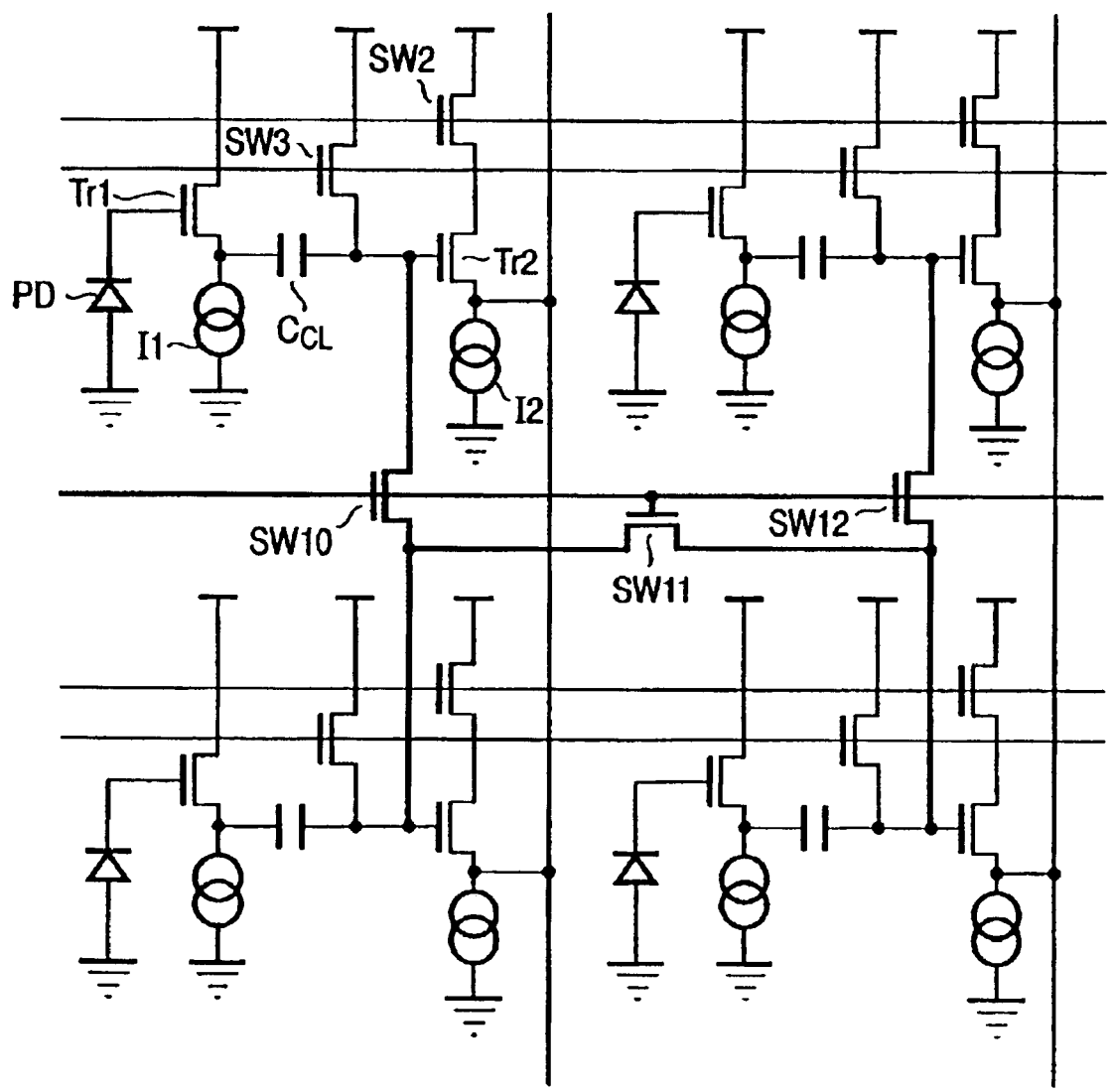
FIG. 4 is a circuit diagram showing the circuit arrangement for four pixels of an image sensing apparatus according to a second embodiment of the present invention.

FIG. 4 shows the circuit arrangement for four pixels of an image sensing apparatus according to the second embodiment of the present invention. In FIG. 4, a reset switch for a photodiode of each pixel is not shown. In practice, a reset MOS transistor is connected to the cathode of the photodiode, and is turned on to reset the photodiode.

As shown in FIG. 4, in the second embodiment, a clamp capacitor CCL is inserted between the source-follower circuit for amplification, which comprises the transistor Tr1 and current source I1, and amplifies and output a signal from the photodiode PD in one pixel, and the source-follower circuit for the vertical output line, which comprises the transistor Tr2 and current source I2. The clamp capacitor CCL is inserted for the purpose of removing kTC noise and fixed pattern noise (FPN) upon resetting the photodiode PD.

Noise removal can be attained by the following operation. A switch SW3 is turned on to set the electrode of the clamp capacitor CCL on the side of the transistor Tr2 at a constant potential. In this state, when the photodiode PD is reset by a reset switch (not shown), a noise component is accumulated on the electrode of the clamp capacitor CCL on the transistor Tr1 side. When a signal charge of the photodiode PD is accumulated after the switch SW3 is turned off, the potential at the electrode of the clamp capacitor CCL on the side of the transistor Tr1 drifts in correspondence with the noise component subtracted from a signal (containing the noise component) from the photodiode PD, and the potential at the electrode of the clamp capacitor CCL on the transistor Tr2 side also drifts in correspondence with the noise component removed. In this manner, the clamp capacitor CCL can hold a signal from which the noise component has been removed.

As in the first embodiment, the add switches SW10, SW11, and SW12 are connected to the clamp capacitors CCL on the transistor Tr2 side, and when the add switches SW10, SW11, and SW12 are turned on, the potential in the clamp capacitor CCL in each pixel equals the average potential of the potentials in the clamp capacitors CCL for four pixels before addition. In the second embodiment as well, since the clamp capacitor CCL can be increased, even when each add switch or its wire suffers a leakage current, such leakage current results in neither sensitivity drop nor an increase in noise. In this case, the effect can be enhanced if the clamp capacitor CCL is larger than the capacitance of the photodiode PD. In the second embodiment, the same effect as in the first embodiment can be obtained for the S/N ratio, and Sp/Np<<Si/Ni.

In the second embodiment, since kTC noise and fixed pattern noise (FPN) upon resetting the photodiode can be removed, the sensitivity can be further improved.

(Third Embodiment)

Figure 5:
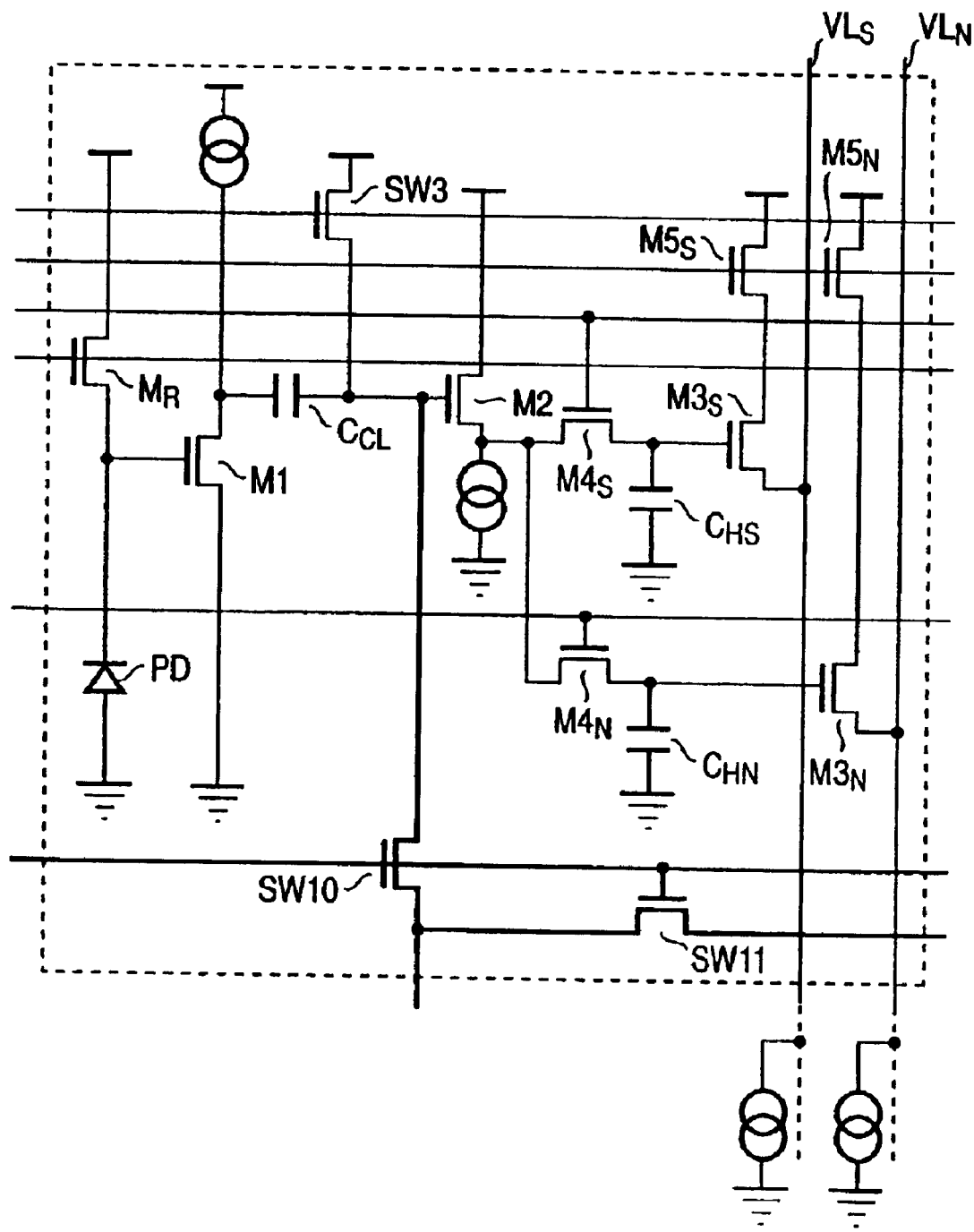
FIG. 5 is a circuit diagram showing the circuit arrangement for one pixel of an image sensing apparatus according to a third embodiment of the present invention.

FIG. 5 shows the circuit arrangement for one pixel of an image sensing apparatus according to the third embodiment of the present invention.

In FIG. 5, a reset switch MR for the photodiode PD of each pixel is arranged, and is connected to the cathode of the photodiode PD. When the reset switch (MOS transistor) MR is turned on, the photodiode PD is reset. In the first and second embodiments, a reset switch for the photodiode in each pixel is not shown, but the same reset switch as the reset switch MR for the photodiode in the third embodiment can be used.

As shown in FIG. 5, in the third embodiment, the same clamp capacitor CCL as in the second embodiment is connected, and a signal sample/hold capacitor CHS and a noise sample/hold capacitor CHN are added. An amplified signal is transferred to and accumulated in the capacitor CHS via a transfer MOS transistor M4S, and amplified noise is transferred to and accumulated in the capacitor CHN via a transfer MOS transistor M4N. The accumulated signal and noise can be respectively transferred onto vertical output lines VLS and VLN by turning on select MOS transistors M5S and M5N. When the transfer MOS transistors M4S and M4N are turned off, since the photodiode PD and the capacitors CHS and CHN can be electrically isolated from each other, the signal accumulation operation of the photodiode PD and the signal read operation from the capacitors CHS and CHN can be independently executed.

A MOS transistor M1 and a current source connected to it form a first source-follower circuit (first amplifier), a MOS transistor M2 and a current source connected to it form a second source-follower circuit (second amplifier), and a MOS transistor M3S and a current source connected to it, and a MOS transistor M3N and a current source connected to it respectively form third and fourth source-follower circuits (third and fourth amplifiers).

The add switches SW10, SW11, and SW12 (SW12 is not shown) are connected to the clamp capacitor CCL on the MOS transistor M2 side as in the second embodiment. In the third embodiment as well, the same effect as in the first embodiment can be obtained for the S/N ratio, and Sp/Np<<Si/Ni.

In the third embodiment, since kTC noise and fixed pattern noise (FPN) generated upon resetting the photodiode can be removed, and the signal accumulation operation and signal read operation can be independently executed, the photodiodes of all the pixels can have equal accumulation timings. Also, since two different sample/hold circuits for a signal and noise are arranged, drifts of the MOS transistors M1 and M2 can be removed.

(Fourth Embodiment)

Figure 6:
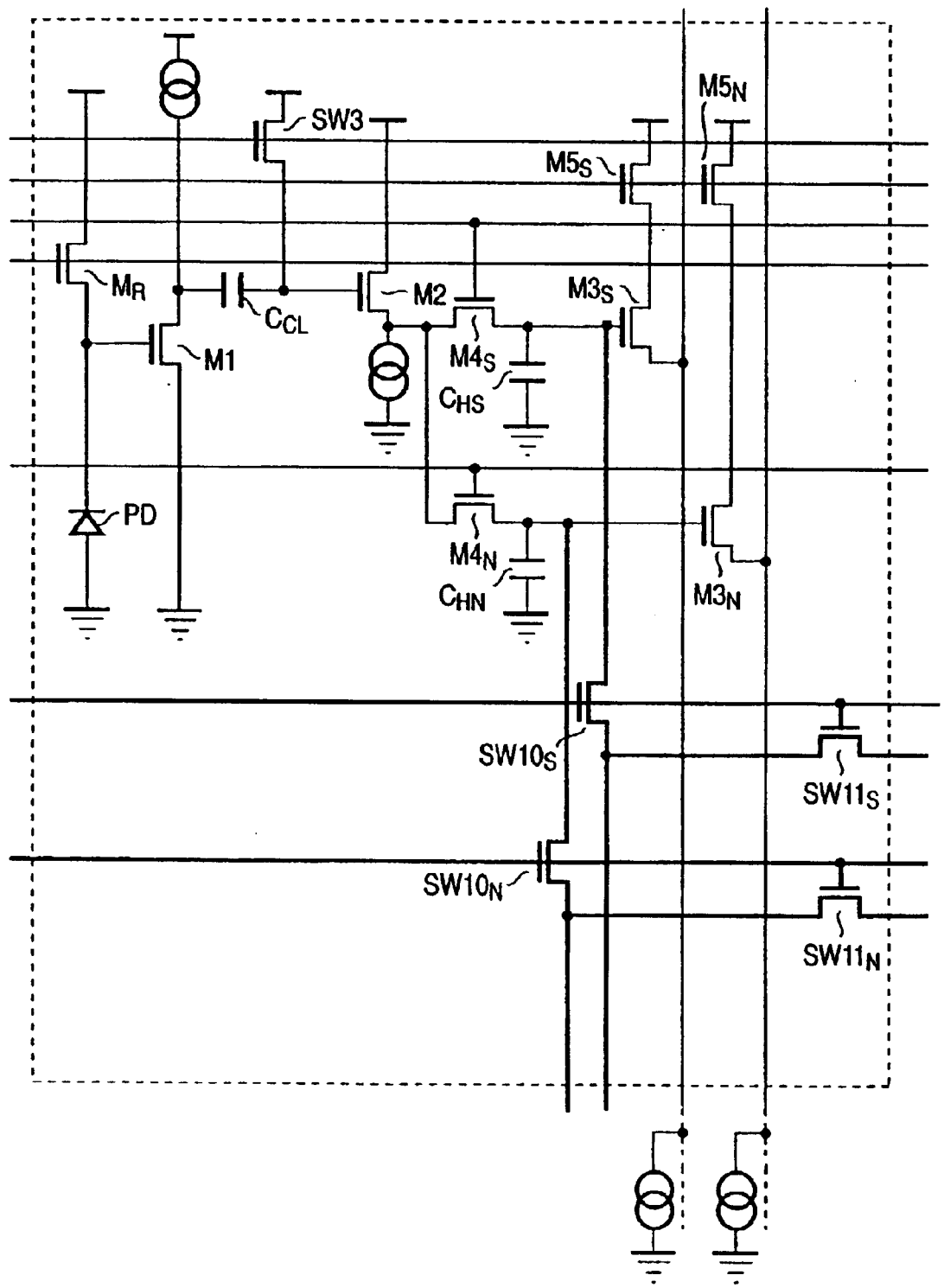
FIG. 6 is a circuit diagram showing the circuit arrangement for one pixel of an image sensing apparatus according to a fourth embodiment of the present invention.

FIG. 6 shows the circuit arrangement for one pixel in an image sensing apparatus according to the fourth embodiment of the present invention. In the fourth embodiment, add switches SW10S, SW11S, and SW12S, and add switches SW10N, SW11N, and SW12N (SW12S and SW12N are not shown) are respectively connected to the outputs of the two different signal and noise sample/hold capacitors CHS and CHN in the arrangement of the third embodiment shown in FIG. 5.

Compared to the third embodiment, the fourth embodiment can further reduce shot noise of the MOS transistor M2 and 1/f noise to:

$(1/n)^{**}(1/2)$ (n is the number of added outputs)

(Fifth Embodiment)

Figure 7:
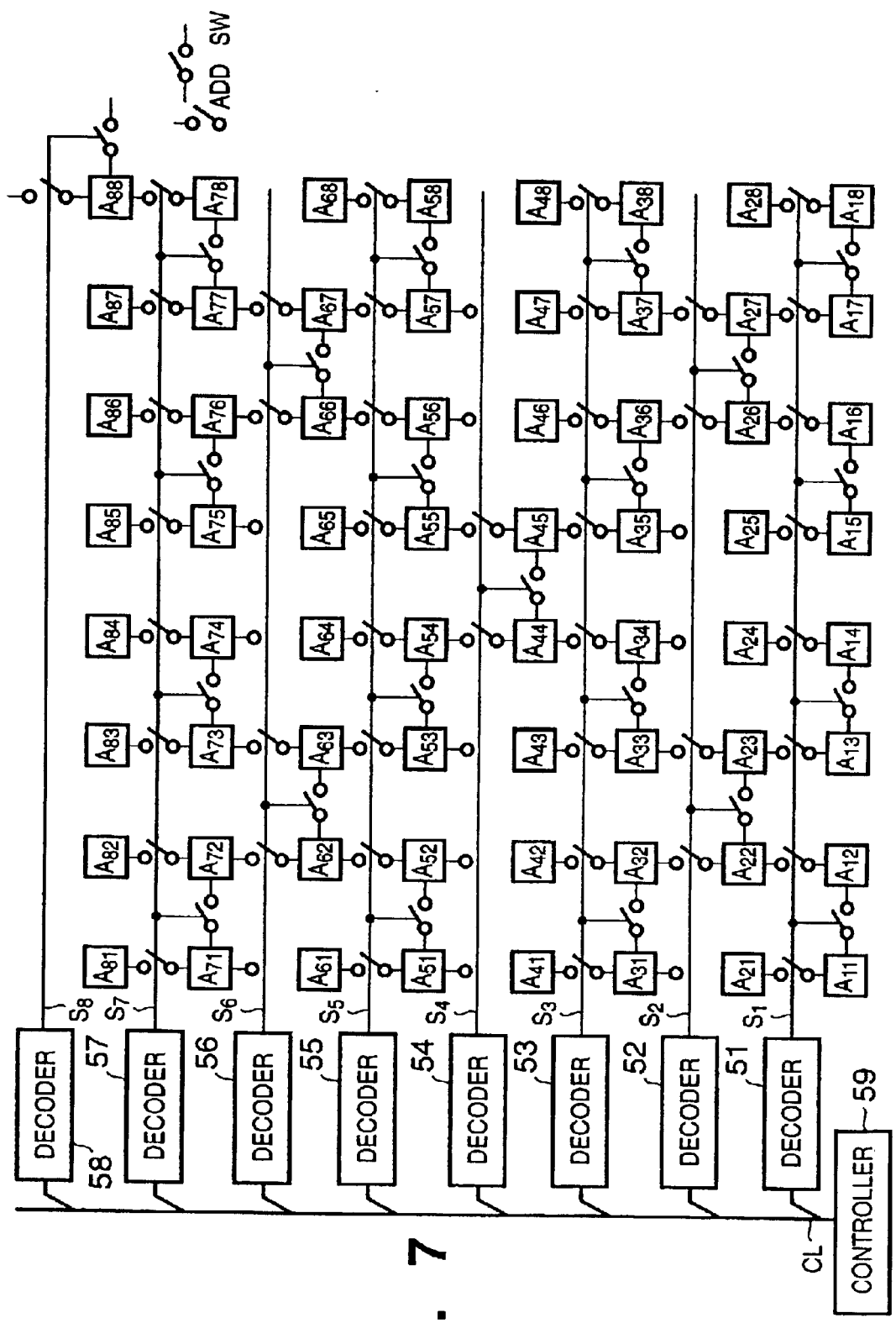
FIG. 7 is a diagram showing the arrangement of an image sensing element according to a fifth embodiment of the present invention.
Figure 8A:
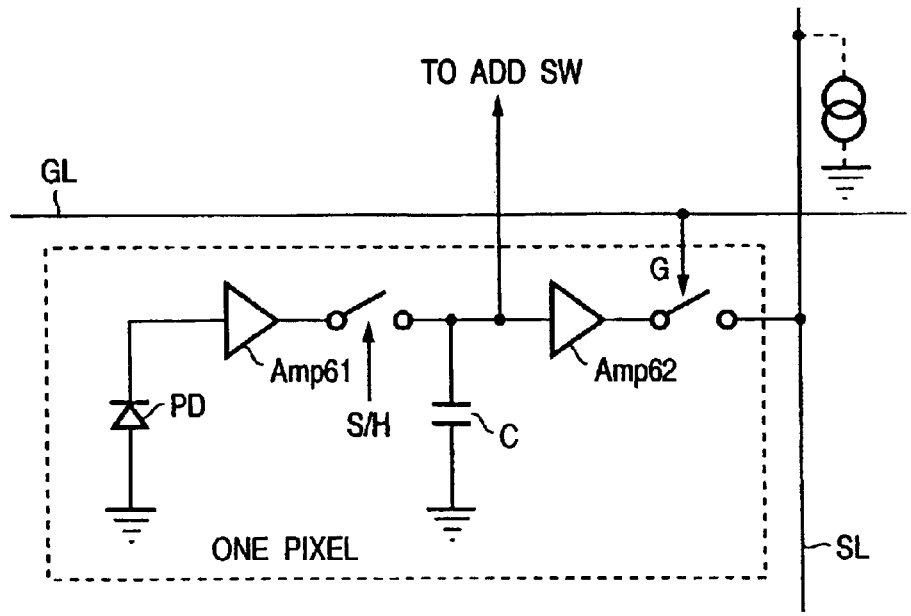
FIGS. 8A to 8C are circuit diagrams showing the arrangement for one pixel in the fifth embodiment of the present invention.
Figure 8B:
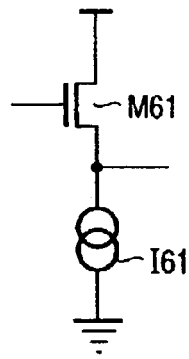
Figure 8C:
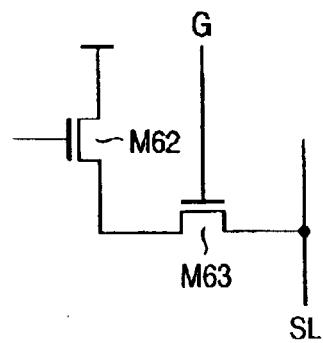

FIG. 7 shows a schematic arrangement of an image sensing apparatus according to the fifth embodiment of the present invention. FIG. 7 shows 8×8 pixels. Reference numerals A11 to A88 denote pixels; S1 to S8, control lines for controlling add switches (SW); CL, a plurality of add mode control lines; 51 to 58, decoders, and 59, a controller for controlling charge read from pixels by controlling the decoders 51 to 58. FIGS. 8A to 8C show the arrangement for one pixel. FIGS. 9A to 9D respectively show 4-, 16-, 64-, and 256-pixel add states.

Figure 9B:
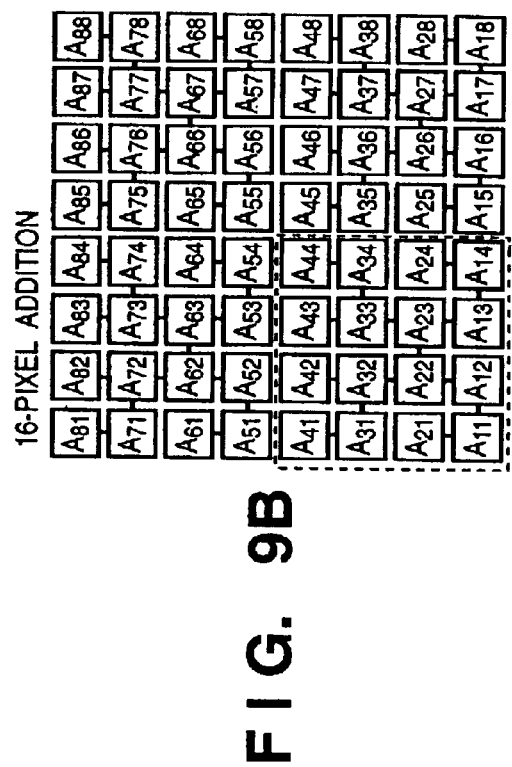
FIGS. 9A to 9D respectively show 4-, 16-, 64-, and 256-pixel add states in the fifth embodiment of the present invention.
Figure 9D:
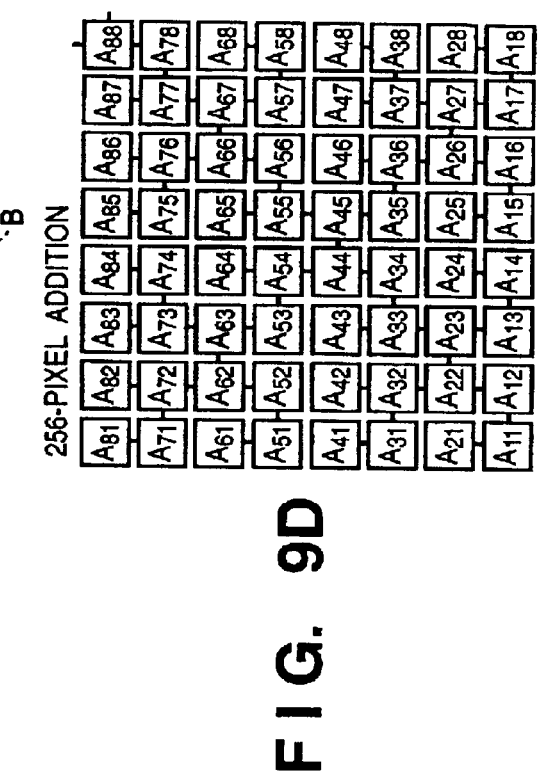
Figure 9A:
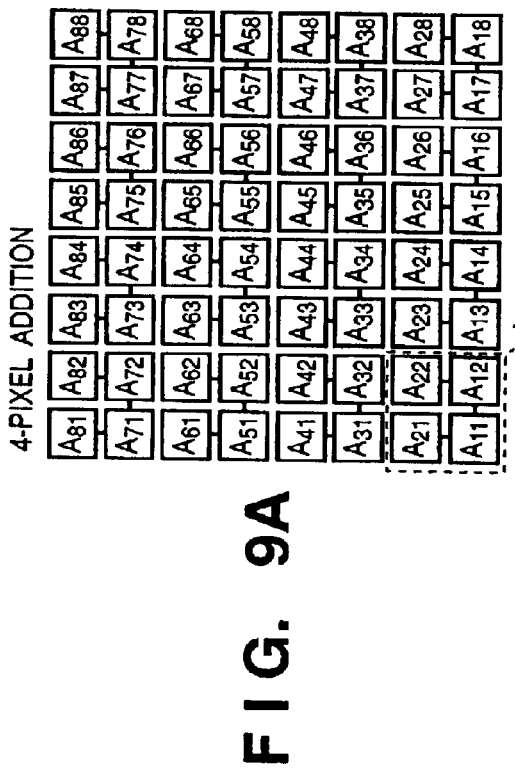

In case of 4-pixel addition, as shown in FIG. 9A, the controller 59 sets every other control lines (e.g., control lines S1, S3, S5, and S7 in FIG. 7) at high level to turn on the add switches connected to these lines, and to commonly connect pixels in units of 4 pixels. For example, pixels A11, A12, A21, and A22 are commonly connected in region A shown in FIG. 9A to add signal charges.

In case of 16-pixel addition, as shown in FIG. 9B, the controller 59 sets at high level three control lines out of four control lines (e.g., control lines S1, S2, S3, S5, S6, and S7 in FIG. 7) to turn on the add switches connected to these lines, and to commonly connect pixels in units of 16 pixels. For example, pixels A11 to A14, A21 to A24, A32 to A34, and A41 to A44 are commonly connected in region B shown in FIG. 9B to add signal charges.

Figure 9C:
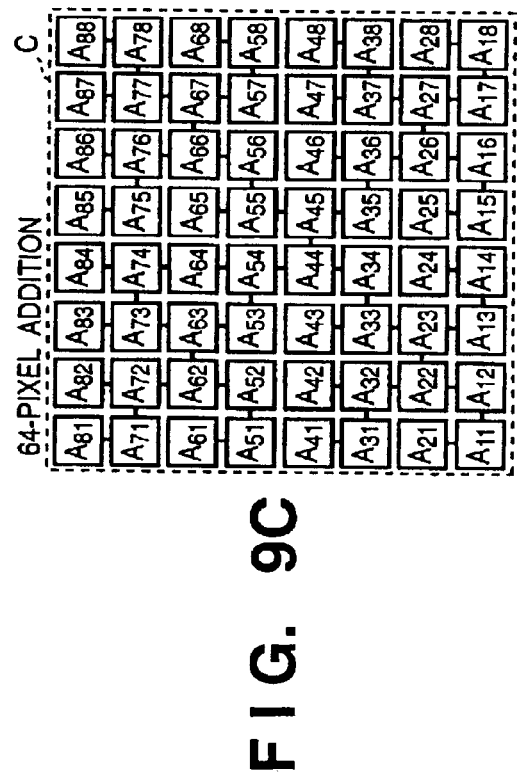

In case of 64-pixel addition, as shown in FIG. 9C, the controller 59 sets at high level seven control lines out of eight control lines (e.g., control lines S1 to S7, and S9 to S15 (S9 to S15 are not shown) in FIG. 7) to turn on the add switches connected to these lines, and to commonly connect pixels in units of 64 pixels. For example, pixels A11 to A88 are commonly connected in region C shown in FIG. 9C to add signals.

In case of 256-pixel addition, as shown in FIG. 9D, the controller 59 sets at high level sets of 15 control lines except for the 16th line after each set (e.g., control lines S1 to S15, and S17 to S31 (S9 to S31 are not shown) in FIG. 7) to turn on the add switches connected to these lines, and to commonly connect pixels in units of 256 pixels.

In the fifth embodiment, if region A shown in FIG. 9A is defined as a first pixel group (four pixels and three add switches), a second pixel group corresponds to region B (16 pixels and 15 add switches) shown in FIG. 9B, and a third pixel group corresponds to region C shown in FIG. 9C.

Figure 10A:
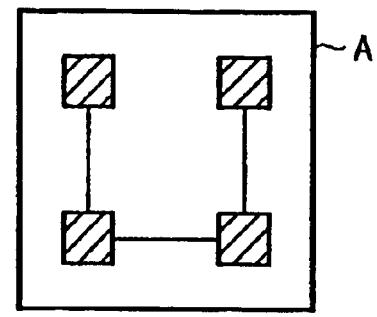
FIGS. 10A to 10D are explanatory views for explaining the addition method in the fifth embodiment of the present invention.
Figure 10B:
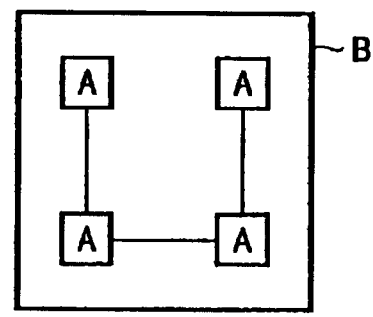
Figure 10C:
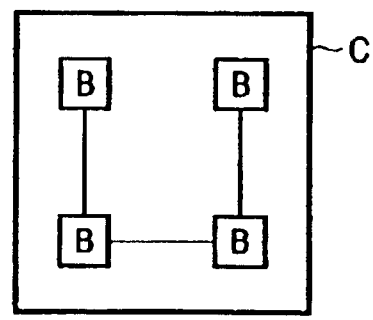
Figure 10D:
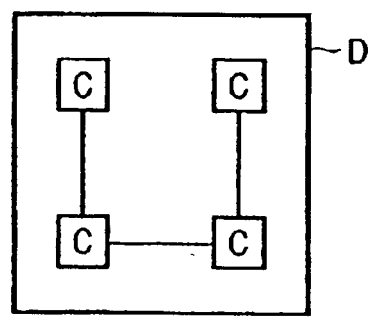

The aforementioned addition method will be explained below using FIGS. 10A to 10D. In case of 4-pixel addition, as shown in FIG. 10A, four pixels (each black square in FIG. 10A indicates one pixel) are added using three add switches. An add pixel unit in this case corresponds to add region A. In case of 16-pixel addition, as shown in FIG. 10B, four add regions A in each of which four pixels are added are added using three add switches. An add pixel unit in this case corresponds to add region B. In case of 64-pixel addition, as shown in FIG. 10C, four add regions B in each of which 16 pixels are added are added using three add switches. An add pixel unit in this case corresponds to add region C. In case of 256-pixel addition, as shown in FIG. 10D, four add regions C in each of which 64 pixels are added are added using three add switches. An add pixel unit in this case corresponds to add region D. As can be understood from FIGS. 10A to 10D, in the fifth embodiment, four pixels or add regions are connected by turning on three add switches.

An example of the arrangement for one pixel will be explained below using FIGS. 8A to 8C. As shown in FIG. 8A, the cathode of the photodiode PD is connected to a first amplifier Amp61, a switch (this switch is a sampling switch controlled by a sample/hold signal (S/H)) and capacitor C, which form a sample/hold circuit, are connected to the output side of the first amplifier Amp61, and the capacitor C is connected to a second amplifier Amp62. The output from the second amplifier Amp62 is output onto a vertical output line SL via a switch, which is controlled by a control signal G. The first amplifier Amp61 comprises a source-follower circuit formed by a MOS transistor M61 and current source I61, as shown in, e.g., FIG. 8B. The second amplifier Amp62 and a switch (select switch) comprise a MOS transistor M62 and MOS transistor M63 which is connected to the drain of the transistor M62 (and is controlled by a control signal G applied to a control line GL), as shown in, e.g., FIG. 8C. Pixel addition is attained by connecting their capacitors C via an add switch (SW), and the sum of charges accumulated on the capacitors C, in other words, the average value of potentials, can be output.

Note that the arrangement for each pixel is not limited to that shown in FIGS. 8A to 8C, and each pixel may have a known arrangement. Also, for example, a pixel with the arrangement described in the first to fourth embodiments can be applied.

The pixel add & read operation has been explained. Also, by turning off all the add switches, outputs from all the pixels can be read out independently.

As described above, according to the fifth embodiment, since the decoders for controlling switches to attain the pixel add & read operation can be commonly used, the circuit scale can be reduced.

(Sixth Embodiment)

In the fifth embodiment described above, the decoders for controlling the add switches which are used to add pixels are arranged in addition to a scan circuit for reading out signals from the pixels. In the sixth embodiment, the add switches used to add pixels are controlled using signals from a scan circuit such as a shift register or the like, which is used to read out signals from the pixels.

As for the arrangement for each pixel in the sixth embodiment, a pixel having a known arrangement or a pixel having an arrangement shown in FIGS. 8A to 8C or described in the first to fourth embodiment may be applied.

Figure 11:
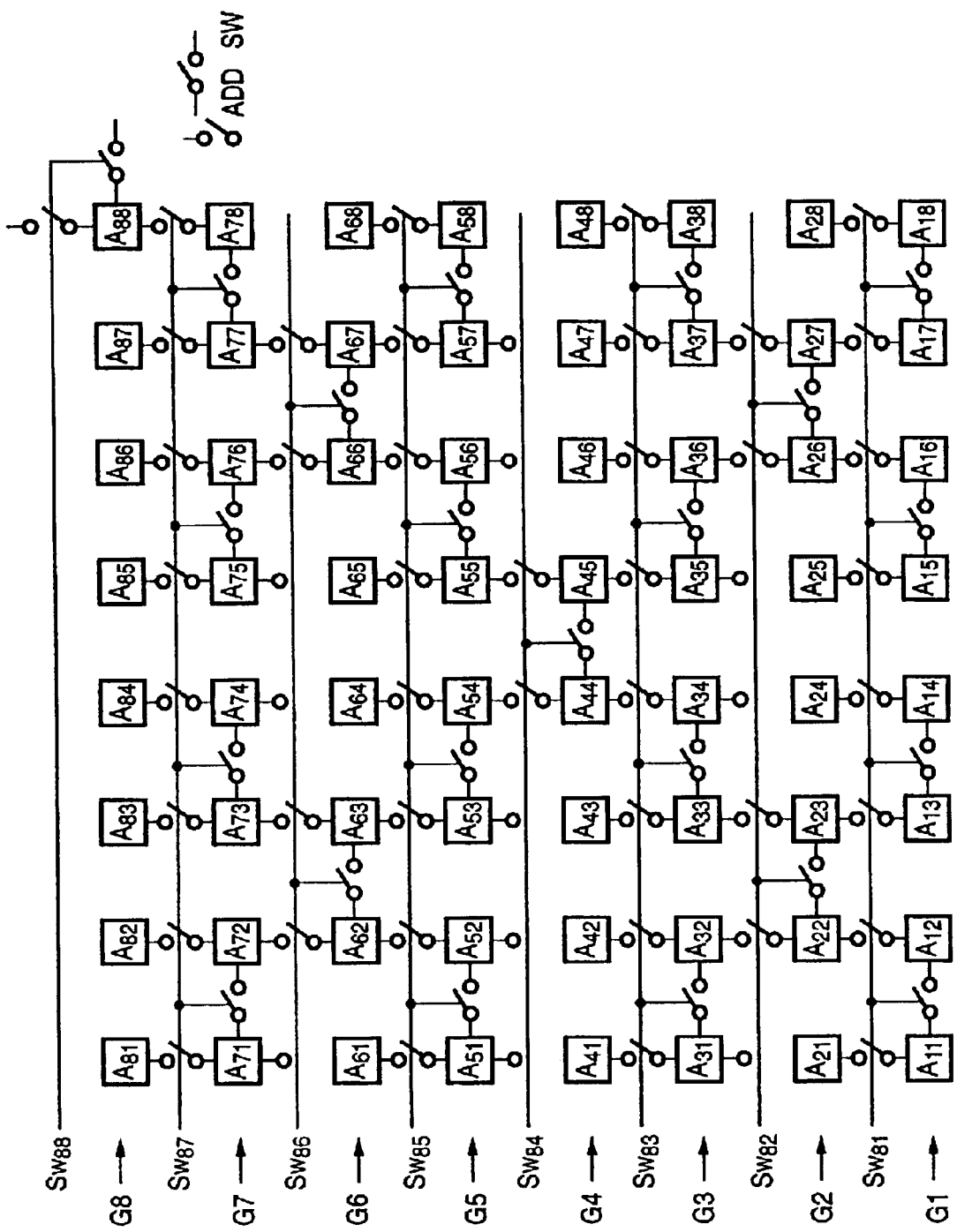
FIG. 11 is a diagram showing the arrangement of an image sensing element according to a sixth embodiment of the present invention.
Figure 12:
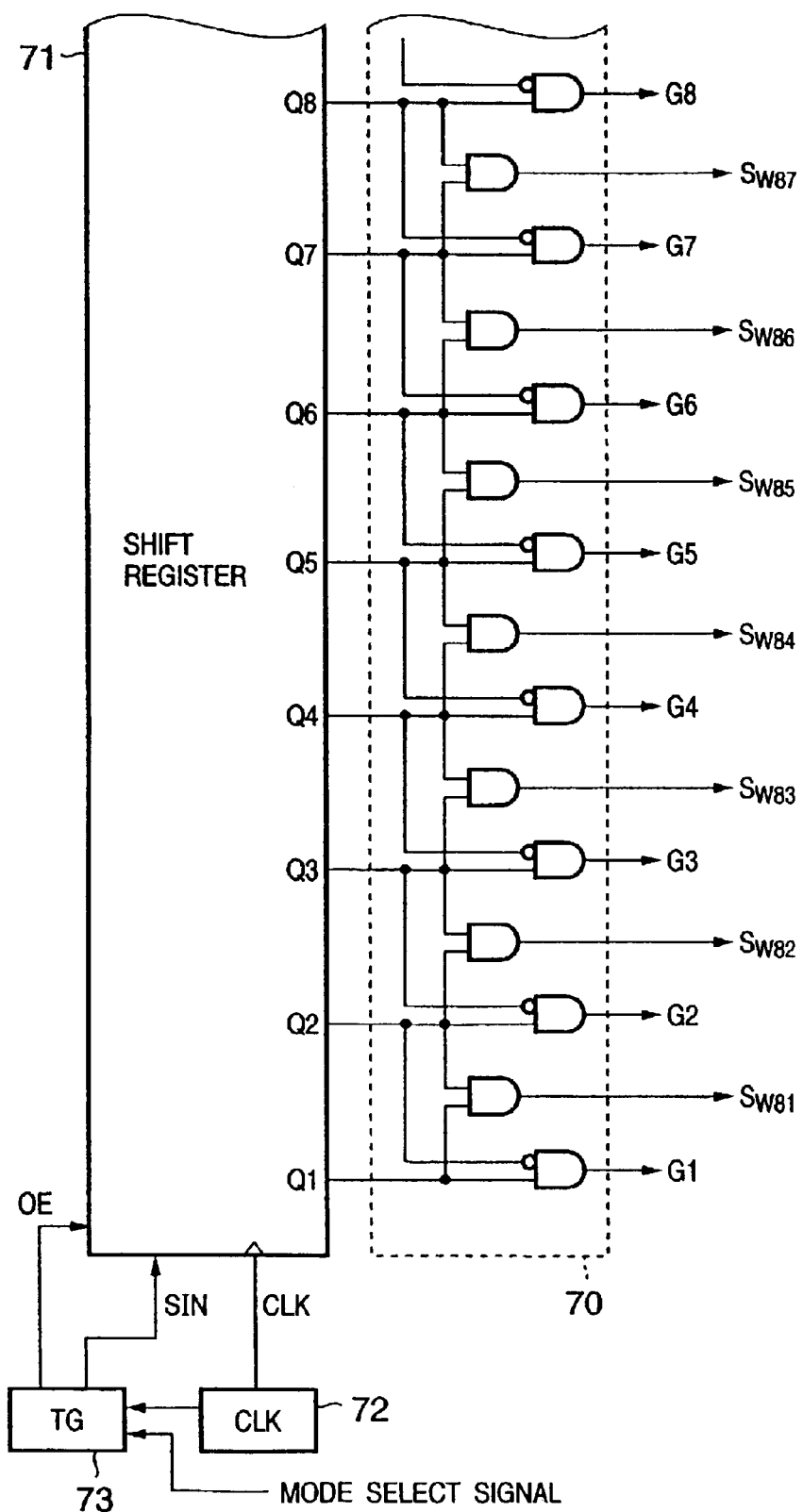
FIG. 12 is a circuit diagram showing a circuit for outputting signals used to control add switches and pixel select switches in the sixth embodiment of the present invention.
Figure 13A:
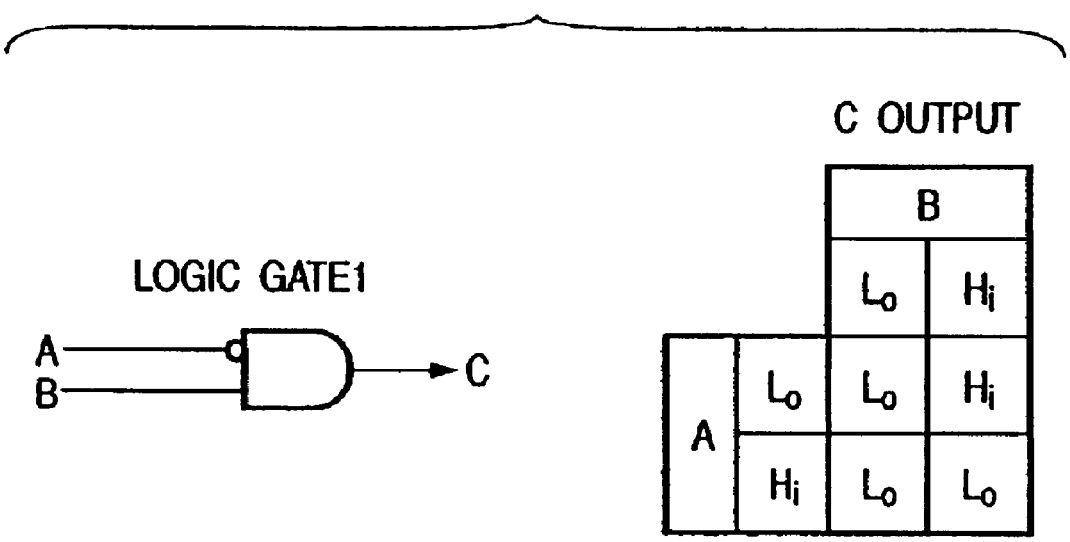
FIGS. 13A and 13B show logic circuits and truth tables used in the circuit shown in FIG. 12.
Figure 13B:
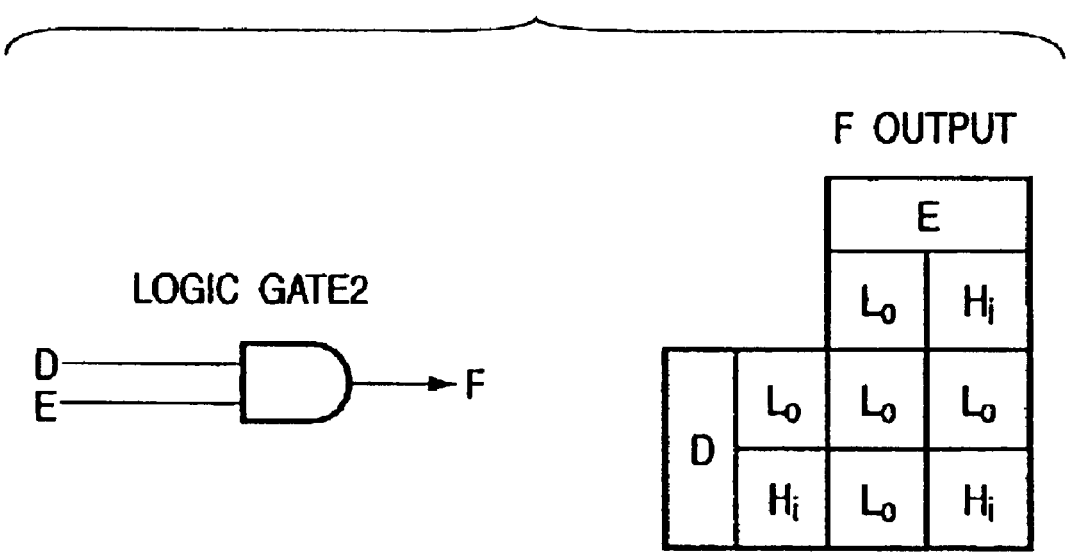

FIG. 11 shows a schematic arrangement of an image sensing apparatus according to the sixth embodiment of the present invention. Referring to FIG. 11, reference numerals Sw81 to w88 denote signal lines for controlling add switches, and signals supplied to these signal lines; and G1 to G8, signals used to execute control for making pixel groups, arranged in one direction, output signals. Each of the signals G1 to G8 is applied to, e.g., the control line GL shown in FIG. 8A. FIG. 12 shows a circuit for outputting signals used to control add switches and pixel select switches. FIGS. 13A and 13B show logic circuits and truth tables used in FIG. 12.

Figure 14:
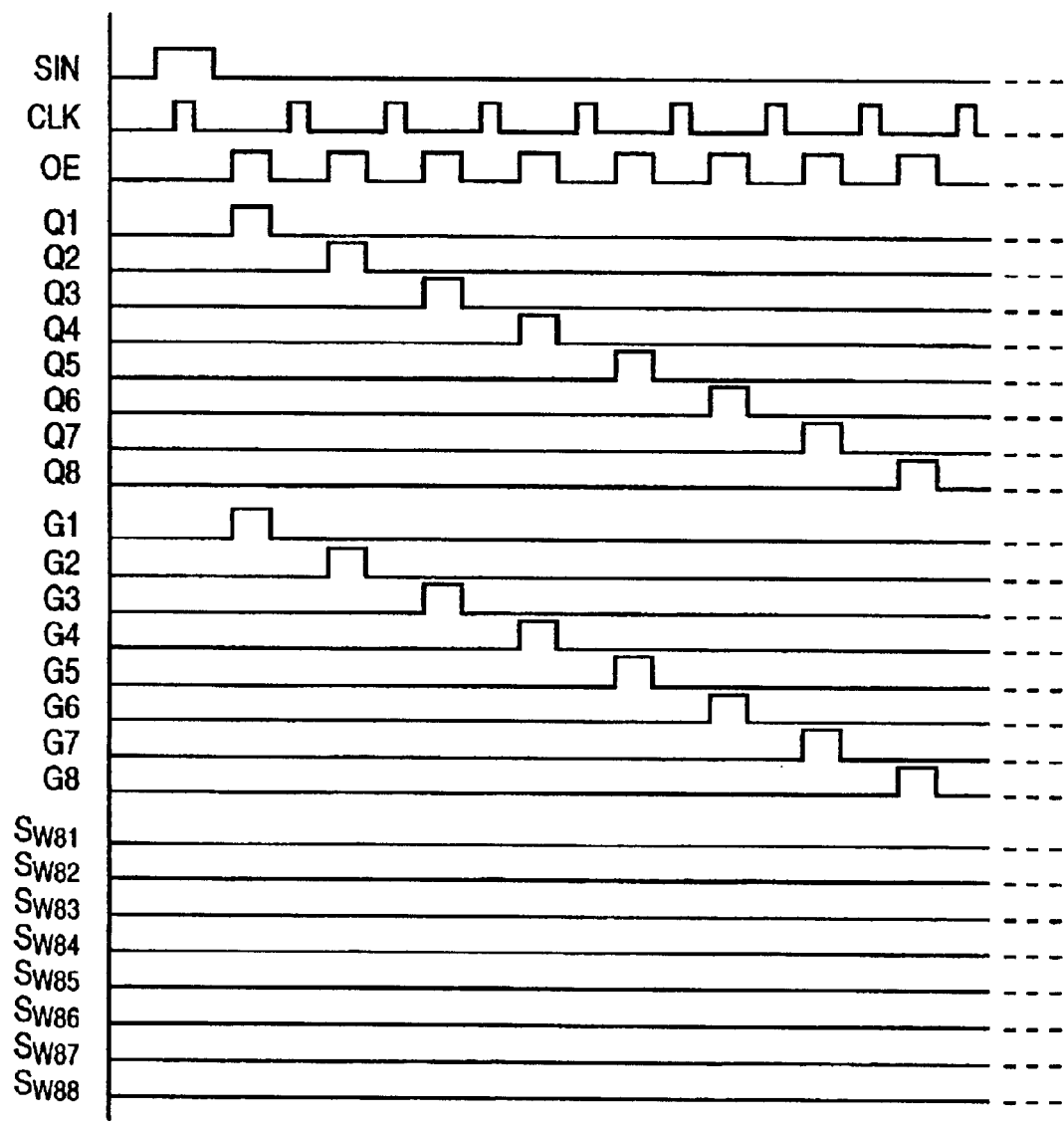
FIG. 14 is a timing chart of a full-pixel read mode in the sixth embodiment of the present invention.
Figure 15:
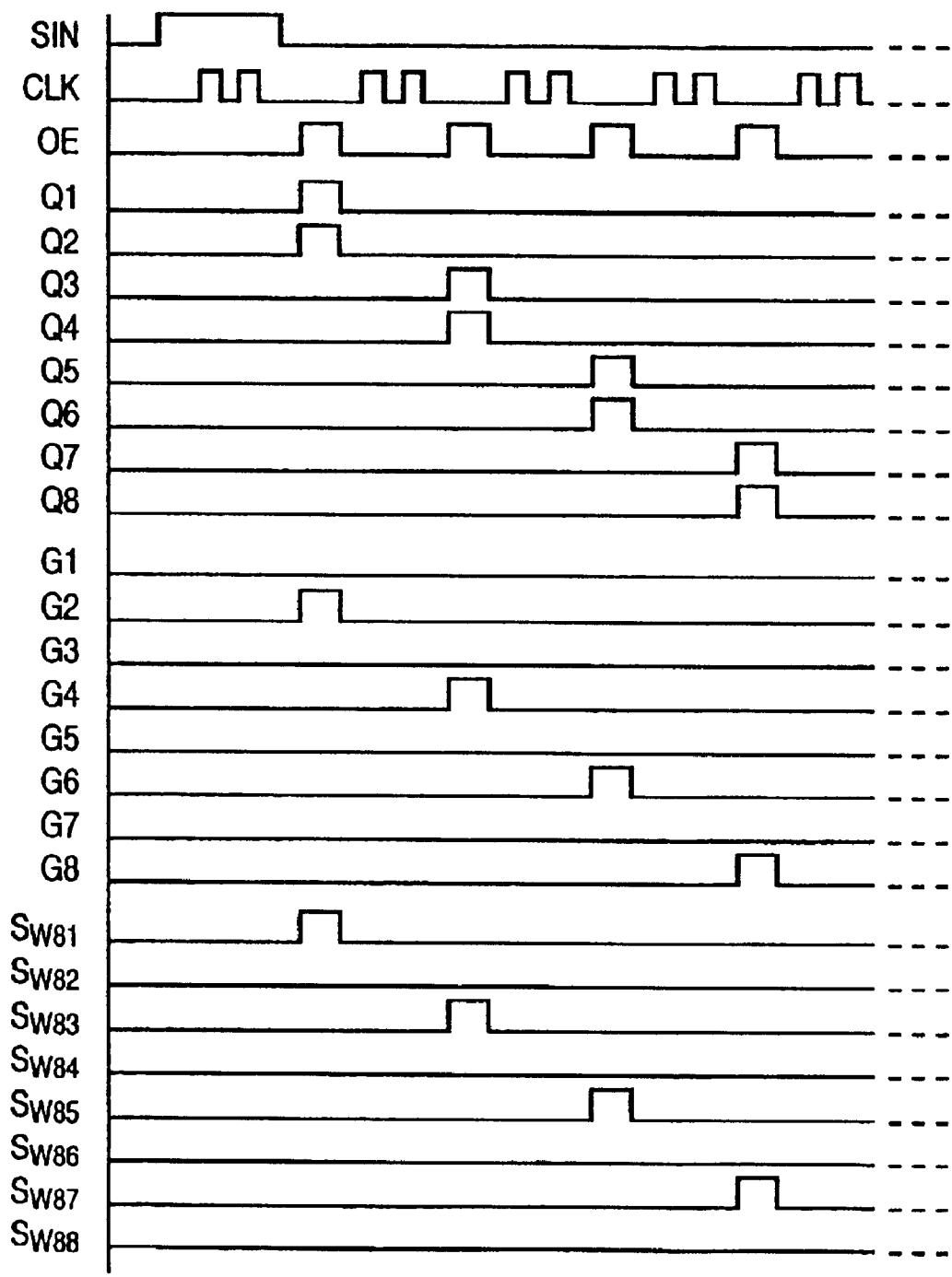
FIG. 15 is a timing chart of a 4-pixel add mode in the sixth embodiment of the present invention.
Figure 16:
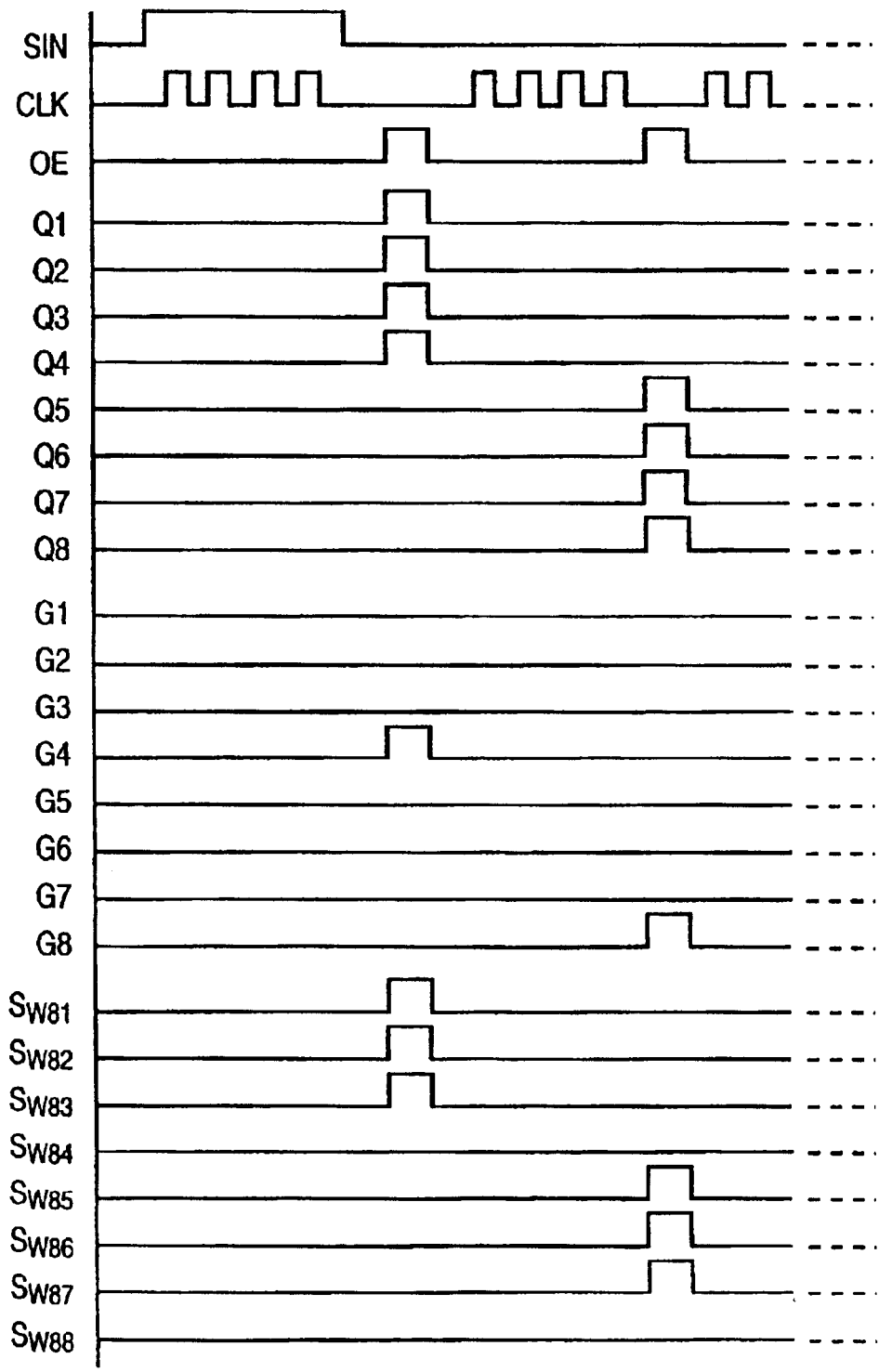
FIG. 16 is a timing chart of a 16-pixel add mode in the sixth embodiment of the present invention.
Figure 17:
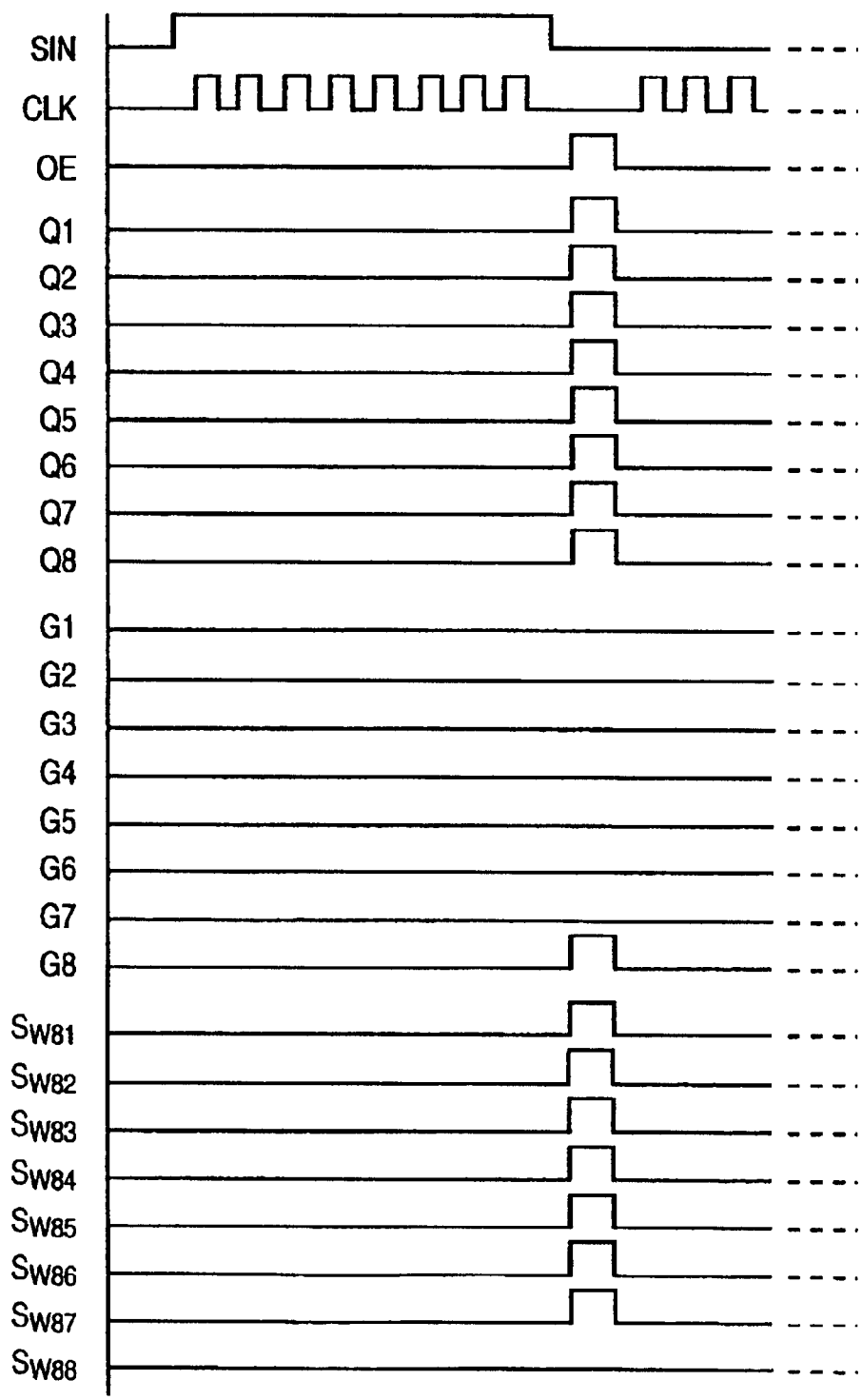
FIG. 17 is a timing chart of a 64-pixel add mode in the sixth embodiment of the present invention.

FIG. 14 is a timing chart in a normal mode (full-pixel read mode), FIG. 15 is a timing chart of a 4-pixel add mode, FIG. 16 is a timing chart of a 16-pixel add mode, and FIG. 17 is a timing chart of a 64-pixel add mode.

The circuit for outputting signals which control the add switches and pixel select switches comprises a shift register 71 for outputting signals Q1 to Q8, and a logic circuit 70, as shown in FIG. 12. The logic circuit 70 comprises logic gates 1 shown in FIG. 13A, and logic gates 2 (AND gates) shown in FIG. 13B, and the inputs of logic gates 1 and 2 are connected between terminals that output the signals Q1 to Q8 of the shift register. Logic gates 1 output control signals G1 to G8, and logic gates 2 output control signals Sw81 to Sw88. Reference symbol OE denotes a signal for ON/OFF-controlling the outputs of the shift register 71. Also, reference symbol SIN denotes a signal for controlling the timing that the shift register 71 fetches a CLK signal supplied from a CLK circuit 72. The OE and SIN signals are output from a timing generator (TG) 73. The TG 73 outputs the OE and SIN signals shown in one of FIGS. 14 to 17 in accordance with the CLK signal supplied from the CLK circuit 72 and a mode select signal which indicates a read mode switched by a mode select switch (not shown).

In the normal mode (full-pixel read mode) shown in FIG. 14, since only one clock pulse CLK is input when SIN is at high level, control signals G1 to G8 sequentially change to high level in response to signals Q1 to Q8 output from the shift register 71, all control signals Sw81 to Sw88 are held at low level, and all the add switches are OFF. Hence, signals are output from respective pixels onto vertical output lines for respective pixel rows.

In the 4-pixel add mode shown in FIG. 15, since two clock pulses CLK are input when SIN is at high level, two shift pulses are generated in the shift register 71. The shift register 71 simultaneously outputs two pulses like signals Q1 and Q2, Q3 and Q4, . . . , control signals G2, G4, G6, and G8, and control signals Sw81, Sw83, Sw85, and Sw87 change to high level in response to these pulses, and the add switches controlled by the control signals Sw81, Sw83, Sw85, and Sw87 are turned on. Hence, the 4-pixel addition process shown in FIG. 9A is done, and a charge sum (average potential) value of pixels in each region A shown in, e.g., FIG. 9A is output.

In the 16-pixel add mode shown in FIG. 16, since four clock pulses CLK are input when SIN is at high level, four shift pulses are generated in the shift register 71. The shift register 71 simultaneously outputs four pulses like signals Q1 to Q4, and Q5 to Q8, control signals G4 and G8 and control signals Sw81 to Sw83 and Sw85 to Sw87 change to high level in response to these pulses, and the add switches controlled by the control signals Sw81 to Sw83 and Sw85 to Sw87 are turned on. Hence, the 16-pixel addition process shown in FIG. 9B is done, and a charge sum (average potential) value of pixels in each region B shown in, e.g., FIG. 9B is output.

In the 64-pixel add mode shown in FIG. 17, since eight clock pulses CLK are input when SIN is at high level, eight shift pulses are generated in the shift register 71. The shift register 71 simultaneously outputs eight pulses like signals Q1 to Q8, and a control signal G8 and control signals Sw81 to Sw87 change to high level in response to these pulses, and the add switches controlled by the control signals Sw81 to Sw87 are turned on. Hence, the 64-pixel addition process shown in FIG. 9C is done, and a charge sum (average potential) value of pixels in each region C shown in, e.g., FIG. 9C is output.

In the sixth embodiment described above, 4-, 16-, and 64-pixel addition processes are made, while taking as an example a case wherein four (a=4) pixels in a matrix and three (a−1=3) first switches form a first pixel group, four (b=4) first pixel groups in a matrix and three (b−1=3) second switches form a second pixel group, and four (c=4) second pixel groups in a matrix and three (c−1=3) third switches form a third pixel groups. However, the number of pixels or pixel groups is not limited to four, and two, three, or five or more pixels or pixel groups may be used.

As described above, according to the sixth embodiment, since switch control for the pixel add & read process can be made using a common shift register and logic circuits, the circuit scale can be reduced.

(Seventh Embodiment)

An image sensing system using the image sensing apparatus of the first to sixth embodiments will be explained below. An embodiment in which the image sensing apparatus of the present invention is applied to a still camera will be described in detail below with reference to FIG. 18.

Figure 18:
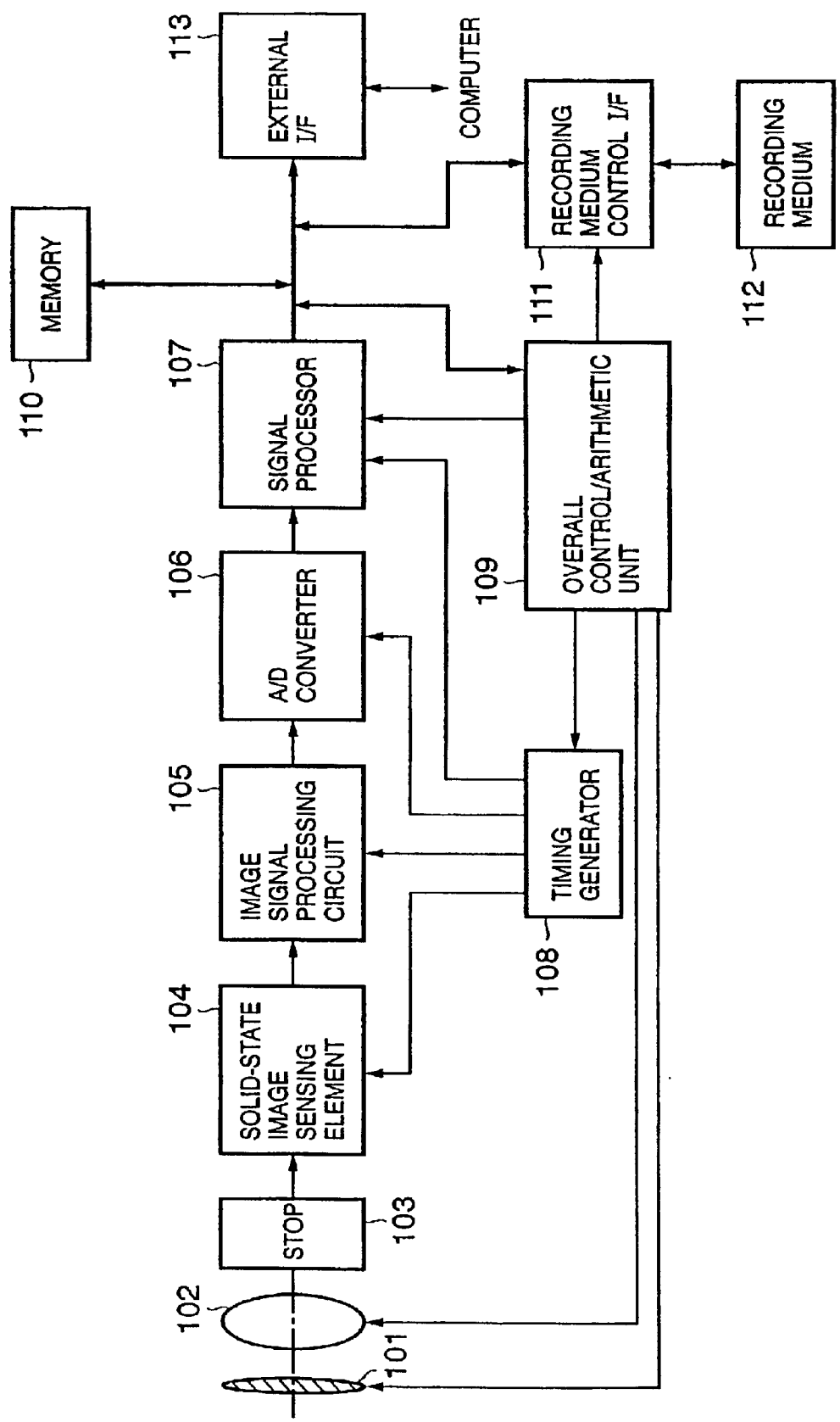
FIG. 18 is a block diagram of a still video camera to which an image sensing apparatus of the present invention is applied.

FIG. 18 is a block diagram showing a case wherein the image sensing apparatus of the present invention is applied to a "still video camera".

Referring to FIG. 18, reference numeral 101 denotes a barrier which serves as a lens protector and main switch; 102, a lens for forming an optical image of an object on an image sensing element (image sensing apparatus) 104; 103, a stop for varying the amount of light that has passed through the lens 102; 104, an image sensing element for capturing an object image formed by the lens 102 as an image signal; 106, an A/D converter for analog-to-digital converting an image signal output from the image sensing element 104; 107, a signal processor for making various kinds of correction for image data output from the A/D converter 106, and compressing data; 108, a timing generator for outputting various timing signals to the image sensing element 104, an image signal processing circuit 105, the A/D converter 106, and the signal processor 107; 109, an overall control/arithmetic unit for controlling various arithmetic operations and the entire still video camera; 110, a memory for temporarily storing image data; 111, an interface for recording or reading out data on or from a recording medium; 112, a detachable recording medium such as a semiconductor memory on or from which image data is recorded or read out; and 113, an interface used to communicate with an external device such as an external computer.

The operation of the still video camera upon image sensing in the above arrangement will be described below.

When the barrier 101 is opened, a main power supply is turned on, a power supply for a control system is then turned on, and a power supply for an image sensing circuit including the A/D converter 106 and the like is also turned on.

In order to control the exposure value, the overall control/arithmetic unit 109 fully opens the stop 103, and a signal output from the image sensing element 104 is converted by the A/D converter 106 and is then input to the signal processor 107. Based on that data, the overall control/arithmetic unit 109 makes arithmetic operations for exposure.

Based on this photometry result, the brightness is determined, and the overall control/arithmetic unit 109 controls the stop in accordance with the determination result.

The overall control/arithmetic unit 109 then computes the distance to an object by extracting high-frequency components from a signal output from the image sensing element 104. After that, the lens 102 is driven to check if an in-focus state is attained. If an in-focus state is not attained, the lens 102 is driven again to measure the distance.

After an in-focus state is confirmed, main exposure starts. Upon completion of exposure, an image signal output from the image sensing element 104 is A/D-converted by the A/D converter 106, and is then written in the memory 110 by the overall control/arithmetic unit 109 via the signal processor 107. The data stored in the memory 110 is recorded on the detachable recording medium 112 such as a semiconductor memory via the recording medium control I/F under the control of the overall control/arithmetic unit 109. Or the data may be directly input to, e.g., a computer via the external I/F 113 and may undergo an image process.

The present invention is not limited to the above embodiments and various changes and modifications can be made within the spirit and scope of the present invention. Therefore to apprise the public of the scope of the present invention, the following claims are made.

What is claimed is:

1. An image sensing apparatus comprising:
    a plurality of pixels arranged in two dimensions, each of said pixels having a photoelectric conversion unit,
    a first amplifier for amplifying and outputting a signal from said photoelectric conversion unit,
    a capacitor connected to an output of said first amplifier, and
    a second amplifier for amplifying and outputting a signal stored in said capacitor;
    and a plurality of first switches, each connected between a plurality of pixels, for commonly connecting said capacitors of not less than two pixels of said plurality of pixels.

2. An image sensing system comprising:
    an image sensing apparatus of claim 1;
    an optical system for forming an optical image on said image sensing apparatus; and
    a signal processing circuit for processing an output signal from said image sensing apparatus.

3. The apparatus according to claim 1, wherein each pixel further has a second switch used to set a predetermined potential,
    one terminal of said capacitor is connected to the output of said first amplifier, and said second switch is connected to the other terminal of said capacitor, and
    said first switches are inserted between said other terminals of said capacitors included in not less than two pixels.

4. The apparatus according to claim 3, wherein each pixel further has:
    a signal holding capacitor which is connected to an output of said second amplifier and holds an output from said second amplifier on the basis of a signal from said photoelectric conversion unit; and
    a noise holding capacitor for holding a noise output from said second amplifier.

5. The apparatus according to claim 4, wherein
    said first switches include a switch for commonly connecting between said signal holding capacitors of not less than two pixels of said plurality of pixels, and a switch for commonly connecting between said noise holding capacitors.

6. An image sensing apparatus comprising:
    a plurality of pixels arranged in a two-dimensional matrix;
    first switches used to couple pixels in a first pixel group formed by a predetermined number of pixels so as to add and read out signals of the first pixel group;
    second switches used to couple a plurality of first pixel groups so as to add and read out signals of a second pixel group formed by the plurality of first pixel groups;
    a first control line which is connected to said first switches in the plurality of first pixel groups and is used to ON/OFF control said first switches;
    a second control line which is connected to said second switches and is used to ON/OFF-control said second switches; and
    a controller for controlling said first and second switches via said first and second control lines, and
    in that said image sensing apparatus has a first mode of independently reading out signals from a plurality of pixels, a second mode of adding and reading out signals for the respective first pixel groups, and a third mode of adding and reading out signals for the respective second pixel groups, and said controller controls to turn off said first and second switches in the first mode, to turn on said first switches and turn off said second switches in the second mode, and to turn on said first and second switches in the third mode, wherein pixels included in each first pixel group are coupled by said first switches, the number of which is smaller by 1 than the number of pixels included in the first pixel group.

7. The apparatus according to claim 6, further comprising third switches used to couple a plurality of second pixel groups so as to add and read out signals of a third pixel group formed by the plurality of second pixel groups, and in that said image sensing apparatus further has a fourth mode of adding and reading out signals for respective third pixel groups, and said controller controls to turn on said first to third switches in the fourth mode.

8. The apparatus according to claim 7, wherein the second pixel groups included in each third pixel group are coupled by said third switches, the number of which is smaller by 1 than the number of second pixel groups included in the third pixel group.

9. The apparatus according to claim 7, wherein each pixel has:

a photoelectric conversion unit;

an amplifier for amplifying and outputting a signal from said photoelectric conversion unit; and a capacitor connected to an output of said amplifier, and said third switches commonly connect between said capacitors.

10. An image sensing apparatus comprising:

a plurality of pixels arranged in a two-dimensional matrix;

first switches used to couple pixels in a first pixel group formed by a predetermined number of pixels so as to add and read out signals of the first pixel group;

second switches used to couple a plurality of first pixel groups so as to add and read out signals of a second pixel group formed by the plurality of first pixel groups;

a first control line which is connected to said first switches in the plurality of first pixel groups and is used to ON/OFF control said first switches;

a second control line which is connected to said second switches and is used to ON/OFF-control said second switches; and a controller for controlling said first and second switches via said first and second control lines, and in that said image sensing apparatus has a first mode of independently reading out signals from a plurality of pixels, a second mode of adding and reading out signals for the respective first pixel groups, and a third mode of adding and reading out signals for the respective second pixel groups, and said controller controls to turn off said first and second switches in the first mode, to turn on said first switches and turn off said second switches in the second mode, and to turn on said first and second switches in the third mode, wherein the first pixel groups included in each second pixel group are coupled by said second switches, the number of which is smaller by 1 than the number of first pixel groups included in the second pixel group.

11. An image sensing apparatus comprising:

a plurality of pixels arranged in a two-dimensional matrix;

first switches used to couple pixels in a first pixel group formed by a predetermined number of pixels so as to add and read out signals of the first pixel group;

second switches used to couple a plurality of first pixel groups so as to add and read out signals of a second pixel group formed by the plurality of first pixel groups;

a first control line which is connected to said first switches in the plurality of first pixel groups and is used to ON/OFF control said first switches;

a second control line which is connected to said second switches and is used to ON/OFF-control said second switches; and a controller for controlling said first and second switches via said first and second control lines, and in that said image sensing apparatus has a first mode of independently reading out signals from a plurality of pixels, a second mode of adding and reading out signals for the respective first pixel groups, and a third mode of adding and said controller controls to turn off said first and second switches in the first mode, to turn on said first switches and turn off said second switches in the second mode, and to turn on said first and second switches in the third mode, wherein each pixel has:

a photoelectric conversion unit;

an amplifier for amplifying and outputting a signal from said photoelectric conversion unit; and a capacitor connected to an output of said amplifier, and said first and second switches commonly connect between said capacitors.

* * * * *

UNITED STATES PATENT AND TRADEMARK OFFICE
CERTIFICATE OF CORRECTION

PATENT NO. : 6,914,227 B2
DATED : July 5, 2005
INVENTOR(S) : Noriyuki Kaifu et al.

It is certified that error appears in the above-identified patent and that said Letters Patent is hereby corrected as shown below:

Column 6,
Line 26, "rows" should read -- row --; and
Line 37, "columns" should read -- column --.

Column 8,
Line 27, "output" should read -- outputs --.

Column 10,
Line 2, "numerals All" should read -- numerals A11 --; and
Line 10, "lines" (first occurrence) should read -- line --.

Column 11,
Line 38, "embodiment" should read -- embodiments --; and
Line 42, "w88" should read -- Sw88 --.

Column 16,
Line 38, "adding and" should read -- adding and reading out signals for the respective second pixel groups, and --.

Signed and Sealed this

First Day of November, 2005

JON W. DUDAS
*Director of the United States Patent and Trademark Office*